United States Patent
Wang et al.

(10) Patent No.: US 11,881,715 B2
(45) Date of Patent: Jan. 23, 2024

(54) ELECTRONIC DEVICE HAVING RECONFIGURABLE MULTI-COIL TRANSFORMER WITH FREQUENCY SELECTIVE FILTERING

(71) Applicant: Apple Inc., Cupertino, CA (US)

(72) Inventors: Hongrui Wang, San Jose, CA (US); Abbas Komijani, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 63 days.

(21) Appl. No.: 17/751,482

(22) Filed: May 23, 2022

(65) Prior Publication Data

US 2023/0378808 A1    Nov. 23, 2023

(51) Int. Cl.
*H02J 50/00*     (2016.01)
*H01F 27/28*     (2006.01)
*H01F 27/02*     (2006.01)
*H02J 50/12*     (2016.01)

(52) U.S. Cl.
CPC .......... *H02J 50/005* (2020.01); *H01F 27/027* (2013.01); *H01F 27/2804* (2013.01); *H02J 50/12* (2016.02); *H01F 2027/2809* (2013.01)

(58) Field of Classification Search
CPC ....... H02J 50/005; H02J 50/12; H01F 27/027; H01F 27/2804; H01F 2027/2809
USPC .......................................................... 307/17
See application file for complete search history.

(56) References Cited

U.S. PATENT DOCUMENTS

| | | | |
|---|---|---|---|
| 7,006,625 B2 | 2/2006 | Rodriguez et al. | |
| 8,198,970 B2 | 6/2012 | Choi et al. | |
| 9,472,385 B2 | 10/2016 | Makarov et al. | |
| 10,110,177 B1 | 10/2018 | Koroglu | |
| 10,284,166 B2 | 5/2019 | Sira | |
| 10,448,858 B2 | 10/2019 | Piron et al. | |
| 11,165,389 B1 | 11/2021 | Komijani et al. | |
| 2013/0207739 A1* | 8/2013 | Bakalski | H04B 1/18 333/33 |
| 2015/0028969 A1 | 1/2015 | Watanabe | |

(Continued)

OTHER PUBLICATIONS

Yumi Lee et al., A Dual-Power-Mode Output Matching Network for Digitally Modulated CMOS Power Amplifier, IEEE Transactions on Microwave Theory and Techniques, Apr. 2013, pp. 1570-1579, vol. 61, No. 4, IEEE, New York, NY, United States.

*Primary Examiner* — Alfonso Perez Borroto

(74) *Attorney, Agent, or Firm* — Treyz Law Group, P.C.; Michael H. Lyons

(57) ABSTRACT

An electronic device may include wireless circuitry having a transformer adjustable between first, second, and third modes. The transformer may have first, second, third, and fourth inductors. The third inductor may be magnetically coupled to the first and second inductors with equal coupling constants. The fourth inductor may be magnetically coupled to the first and second inductors with inverse coupling constants. First and second adjustable capacitors coupled to the third and fourth inductors may receive control signals that place the transformer into a selected one of the first, second, or third modes. In the first mode the transformer exhibits a passband that overlaps first and second bands. In the second mode, the transformer passes signals in the second band while filtering interference in the first band. In the third mode, the transformer passes signals in the first band while filtering interference in the second band.

20 Claims, 14 Drawing Sheets

(56) References Cited

U.S. PATENT DOCUMENTS

| | | |
|---|---|---|
| 2015/0171800 A1* | 6/2015 | Hadjichristos .......... H03F 1/565 |
| | | 330/305 |
| 2017/0187338 A1* | 6/2017 | Wang ........................ H03F 3/68 |
| 2019/0013789 A1 | 1/2019 | Mori |
| 2020/0098501 A1 | 3/2020 | Meister |
| 2020/0111605 A1 | 4/2020 | Chayat et al. |
| 2020/0312540 A1 | 10/2020 | Shi et al. |
| 2022/0021353 A1 | 1/2022 | Han et al. |
| 2022/0077574 A1 | 3/2022 | Hu et al. |

* cited by examiner

ELECTRONIC DEVICE HAVING RECONFIGURABLE MULTI-COIL TRANSFORMER WITH FREQUENCY SELECTIVE FILTERING

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with radio-frequency components that include one or more antennas. Wireless transceiver circuitry in the wireless communications circuitry uses the antennas to transmit and receive radio-frequency signals.

It can be challenging to form satisfactory radio-frequency wireless communications circuitry for an electronic device. If care is not taken, the wireless communications circuitry can be subject to undesirable signal interference in one or more frequency bands used to convey radio-frequency signals.

SUMMARY

An electronic device may include wireless circuitry for performing wireless communications. The wireless circuitry may include a transceiver, an antenna, and front end circuitry between the antenna and the transceiver. The front end circuitry may include an impedance matching network. The impedance matching network may be in a low noise amplifier, as one example. The impedance matching network may have a multi-coil transformer. The multi-coil transformer may be adjustable between a wideband operating mode, a first band rejection operating mode, and a second band rejection operating mode.

The multi-coil transformer may have first, second, third, and fourth inductors. The first inductor may be magnetically coupled to the second inductor via a first magnetic coupling with a first coupling constant. The third inductor may be magnetically coupled to the first inductor via a second magnetic coupling with a second coupling constant and may be magnetically coupled to the second inductor via a third magnetic coupling with a third coupling constant. The fourth inductor may be magnetically coupled to the first inductor via a fourth magnetic coupling with a fourth coupling constant and may be magnetically coupled to the second inductor via a fourth magnetic coupling with a fourth coupling constant. The layout of the first, second, third, and fourth coils may be selected so that the second coupling constant is equal to the third coupling constant and so that the fourth coupling constant is equal to a negative of the fifth coupling constant.

A first adjustable capacitor may be coupled between terminals of the third inductor. A second adjustable capacitor may be coupled between terminals of the fourth inductor. The first and second adjustable capacitors may receive control signals that place the impedance matching network into a selected one of the first, second, and third operating modes. In the first operating mode, the first and second adjustable capacitors form open circuits and the transformer exhibits a first transfer function with a passband that overlaps a first frequency band and a second frequency band higher than the first frequency band. In the second operating mode, the second adjustable capacitor forms an open circuit in the fourth inductor and the transformer exhibits a second transfer function that passes signals in the second frequency band while filtering interference in the first frequency band. In the third operating mode, the first adjustable capacitor forms an open circuit in the third inductor and the transformer exhibits a third transfer function that passes signals in the first frequency band while filtering interference in the second frequency band. A peak detector may be used to detect the frequency of the interference and the adjustable capacitors may be tuned based on the detected frequency. This may allow the impedance matching circuitry to cover inter-band carrier aggregation (CA) communications while also dynamically mitigating interference without unnecessary increases in chip area.

An aspect of the disclosure provides a transformer configured to receive radio-frequency signals conveyed along a signal path. The transformer can include a first inductor disposed on the signal path. The transformer can include a second inductor disposed on the signal path and at least partially overlapping the first inductor. The transformer can include a third inductor disposed adjacent to a portion of the first inductor and partially overlapping the second inductor. The transformer can include a fourth inductor at least partially overlapping the first inductor, the second inductor, and the third inductor.

An aspect of the disclosure provides an electronic device. The electronic device can include an antenna. The electronic device can include a signal path communicably coupled to the antenna and configured to convey radio-frequency signals for the antenna. The electronic device can include an impedance matching network comprising. The electronic device can include a first inductor disposed on the signal path. The electronic device can include a second inductor disposed on the signal path, the first inductor being magnetically coupled to the second inductor with a first coupling constant. The electronic device can include a third inductor magnetically coupled to the first inductor with a second coupling constant and magnetically coupled to the second inductor with a third coupling constant equal to a negative of the second coupling constant.

An aspect of the disclosure provides a method of operating an electronic device having a signal path with a transformer that includes a first coil, a second coil, a third coil, a fourth coil, a first adjustable capacitor coupled to the third coil, and a second adjustable capacitor coupled to the fourth coil. The method can include forming a first open circuit in the third coil and a second open circuit in the fourth coil, the first open circuit in the third coil and the second open circuit in the fourth coil configuring the transformer to pass radio-frequency signals in a first frequency band and a second frequency band higher than the first frequency band. The method can include forming the second open circuit in the fourth coil and controlling the first adjustable capacitor to form a non-open circuit capacitance in the third coil, the second open circuit in the fourth coil and the non-open circuit capacitance in the third coil configuring the transformer to pass the radio-frequency signals in the second frequency band while filtering out the first frequency band.

DETAILED DESCRIPTION

Figure 1:
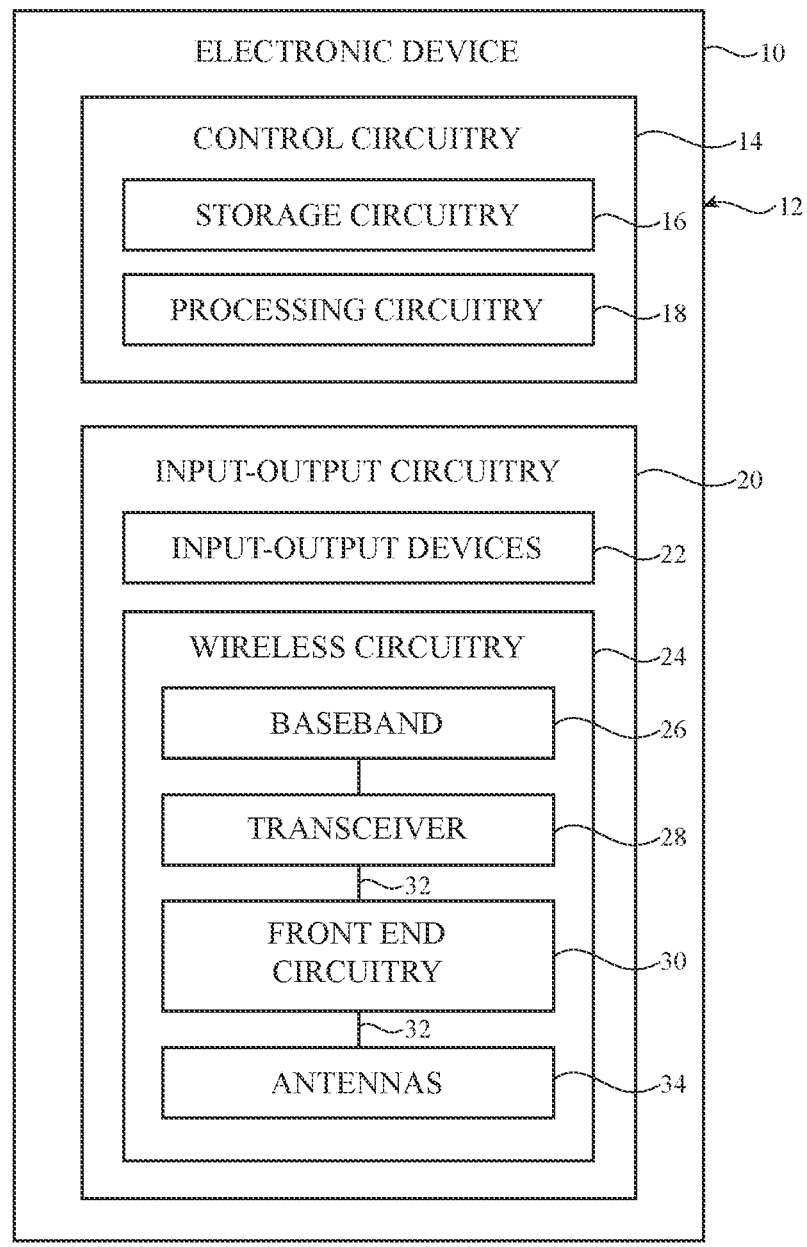
FIG. 1 is a schematic diagram of an illustrative electronic device having wireless circuitry in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, Sixth Generation (6G) protocols, sub-THz protocols, THz protocols, etc.), antenna diversity protocols, satellite navigation system protocols (e.g., global positioning system (GPS) protocols, global navigation satellite system (GLONASS) protocols, etc.), antenna-based spatial ranging protocols, optical communications protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include baseband circuitry such as baseband circuitry 26 (e.g., one or more baseband processors and/or other circuitry that operates at baseband), radio-frequency (RF) transceiver circuitry such as transceiver 28, radio-frequency front end circuitry such as front end circuitry 30, and one or more antennas 34. If desired, wireless circuitry 24 may include multiple antennas 34 that are arranged into a phased antenna array (sometimes referred to as a phased array antenna) that conveys radio-frequency signals within a corresponding signal beam that can be steered in different directions. Baseband circuitry 26 may be coupled to transceiver 28 over one or more baseband data paths. Transceiver 28 may be coupled to antennas 34 over one or more radio-frequency transmission line paths 32. Front end circuitry 30 may be disposed on radio-frequency transmission line path(s) 32 between transceiver 28 and antennas 34.

In the example of FIG. 1, wireless circuitry 24 is illustrated as including only a single transceiver 28 and a single radio-frequency transmission line path 32 for the sake of clarity. In general, wireless circuitry 24 may include any desired number of transceivers 28, any desired number of radio-frequency transmission line paths 32, and any desired number of antennas 34. Each transceiver 28 may be coupled to one or more antennas 34 over respective radio-frequency transmission line paths 32. Each radio-frequency transmission line path 32 may have respective front end circuitry 30 disposed thereon. If desired, front end circuitry 30 may be shared by multiple radio-frequency transmission line paths 32.

Radio-frequency transmission line path 32 may be coupled to antenna feeds on one or more antenna 34. Each antenna feed may, for example, include a positive antenna feed terminal and a ground antenna feed terminal. Radio-frequency transmission line path 32 may have a positive transmission line signal path that is coupled to the positive antenna feed terminal and may have a ground transmission line signal path that is coupled to the ground antenna feed terminal. This example is merely illustrative and, in general, antennas 34 may be fed using any desired antenna feeding scheme.

Radio-frequency transmission line path 32 may include transmission lines that are used to route radio-frequency antenna signals within device 10. Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device such as transmission lines in radio-frequency transmission line path 32 may be integrated into rigid and/or flexible printed circuit boards. In one embodiment, radio-frequency transmission line paths such as radio-frequency transmission line path 32 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive). In performing wireless transmission, baseband circuitry 26 may provide baseband signals to transceiver 28. Transceiver 28 may include circuitry for converting the baseband signals received from baseband circuitry 26 into corresponding radio-frequency signals. For example, transceiver 28 may include mixer circuitry for up-converting the baseband signals to radio frequencies prior to transmission over antennas 34. Transceiver 28 may also include digital to analog converter (DAC) and/or analog to digital converter (ADC) circuitry for converting signals between digital and analog domains. Transceiver 28 may transmit the radio-frequency signals over antennas 34 via radio-frequency transmission line path 32 and front end circuitry 30. Antennas 34 may transmit the radio-frequency signals to external wireless equipment by radiating the radio-frequency signals into free space.

In performing wireless reception, antennas 34 may receive radio-frequency signals from the external wireless equipment. The received radio-frequency signals may be conveyed to transceiver 28 via radio-frequency transmission line path 32 and front end circuitry 30. Transceiver 28 may include circuitry for converting the received radio-frequency signals into corresponding baseband signals. For example, transceiver 28 may include mixer circuitry for down-converting the received radio-frequency signals to baseband frequencies prior to conveying the baseband signals to baseband circuitry 26.

Front end circuitry 30 may include radio-frequency front end components that operate on radio-frequency signals conveyed over radio-frequency transmission line path 32. If desired, the radio-frequency front end components may be formed within one or more radio-frequency front end modules (FEMs). Each FEM may include a common substrate such as a printed circuit board substrate for each of the radio-frequency front end components in the FEM. The radio- frequency front end components in front end circuitry 30 may include switching circuitry (e.g., one or more radio-frequency switches), radio-frequency filter circuitry (e.g., low pass filters, high pass filters, notch filters, band pass filters, multiplexing circuitry, duplexer circuitry, diplexer circuitry, triplexer circuitry, etc.), impedance matching circuitry (e.g., circuitry that helps to match the impedance of antennas 34 to the impedance of radio-frequency transmission line path 32), antenna tuning circuitry (e.g., networks of capacitors, resistors, inductors, and/or switches that adjust the frequency response of antennas 34), radio-frequency amplifier circuitry (e.g., power amplifier circuitry and/or low-noise amplifier circuitry), radio-frequency coupler circuitry, charge pump circuitry, power management circuitry, digital control and interface circuitry, and/or any other desired circuitry that operates on the radio-frequency signals transmitted and/or received by antennas 34.

While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband circuitry 26 and/or portions of transceiver 28 (e.g., a host processor on transceiver 28) may form a part of control circuitry 14.

Wireless circuitry 24 may transmit and/or receive wireless signals within corresponding frequency bands of the electromagnetic spectrum (sometimes referred to herein as communications bands or simply as "bands"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-100 GHz, near-field communications (NFC) frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Antennas 34 may be formed using any desired antenna structures. For example, antennas 34 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Parasitic elements may be included in antennas 34 to adjust antenna performance.

Filter circuitry, switching circuitry, impedance matching circuitry, and other circuitry may be interposed within radio-frequency transmission line path 32, may be incorporated into front end circuitry 30, and/or may be incorporated into antennas 34 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antennas 34 over time.

In general, transceiver 28 may cover (handle) any suitable communications (frequency) bands of interest. The transceiver may convey radio-frequency signals using antennas 34 (e.g., antennas 34 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 34 may transmit the radio-frequency signals by radiating the radio-frequency signals into free space (or to free space through intervening device structures such as a dielectric cover layer). Antennas 34 may additionally or alternatively receive the radio-frequency signals from free space (e.g., through intervening devices structures such as a dielectric cover layer). The transmission and reception of radio-frequency signals by antennas 34 each involve the excitation or resonance of antenna currents on an antenna resonating element in the antenna by the radio-frequency signals within the frequency band(s) of operation of the antennas.

In example where multiple antennas 34 are arranged in a phased antenna array, each antenna 34 may form a respective antenna element of the phased antenna array. Conveying radio-frequency signals using the phased antenna array may allow for greater peak signal gain relative to scenarios where individual antennas 34 are used to convey radio-frequency signals. In satellite navigation system links, cellular telephone links, and other long-range links, radio-frequency signals are typically used to convey data over thousands of feet or miles. In Wi-Fi®and Bluetooth® links at 2.4 and 5 GHz and other short-range wireless links, radio-frequency signals are typically used to convey data over tens or hundreds of feet. In scenarios where millimeter or centimeter wave frequencies are used to convey radio-frequency signals, a phased antenna array may convey radio-frequency signals over short distances that travel over a line-of-sight path. To enhance signal reception for millimeter and centimeter wave communications, the phased antenna array may convey radio-frequency signals using beam steering techniques (e.g., schemes in which antenna signal phase and/or magnitude for each antenna in an array are adjusted to perform beam steering).

For example, each antenna 34 in the phased antenna array may be coupled to a corresponding phase and magnitude controller in front end circuitry 30. The phase and magnitude controllers may adjust the relative phases and/or magnitudes of the radio-frequency signals that are conveyed by each of the antennas 34 in the phased antenna array. The wireless signals that are transmitted or received by the phased antenna array in a particular direction may collectively form a corresponding signal beam. The signal beam may exhibit a peak gain that is oriented in a particular pointing direction at a corresponding pointing angle (e.g., based on constructive and destructive interference from the combination of signals from each antenna in the phased antenna array). Control circuitry 14 may adjust the phase and magnitude controllers to change the direction of the signal beam over time (e.g., to allow device 10 to continue to communicate with external equipment even if the external equipment moves relative to device 10 over time). This example is merely illustrative and, in general, antennas 34 need not be arranged in a phased antenna array.

High frequency bands such as 5G NR FR2 frequency bands have been deployed or are under development across the world. Several frequency bands have already been defined between around 24.25 GHz and 48.2 GHz that support channel bandwidths up to 400 MHz. Data rates can be further increased by aggregating multiple frequency blocks from one frequency band under an intra-band carrier aggregation (CA) scheme or by allocating two or more bands (e.g., using an inter-band CA scheme) to a single user. Front end circuitry 30 therefore needs to be sufficiently wideband to support these channel bandwidths and to allow for transmission and/or reception using intra-band CA or inter-band CA. It may also be desirable for front end circuitry 30 to support these operating modes while minimizing silicon area and complexity (e.g., without utilizing dedicated transmit/receive chains for each frequency band).

When operating at these frequency bands and supporting intra-band and inter-band CA, there may be situations where strong interference at other millimeter wave bands create intermodulation tones in the conveyed radio-frequency signals, which could degrade in-band signal sensitivity. It would therefore be desirable for front end circuitry 30 to be reconfigurable to support both wideband operations for inter-band CA and frequency selective filtering to reject interferences from other frequency bands.

Figure 2:
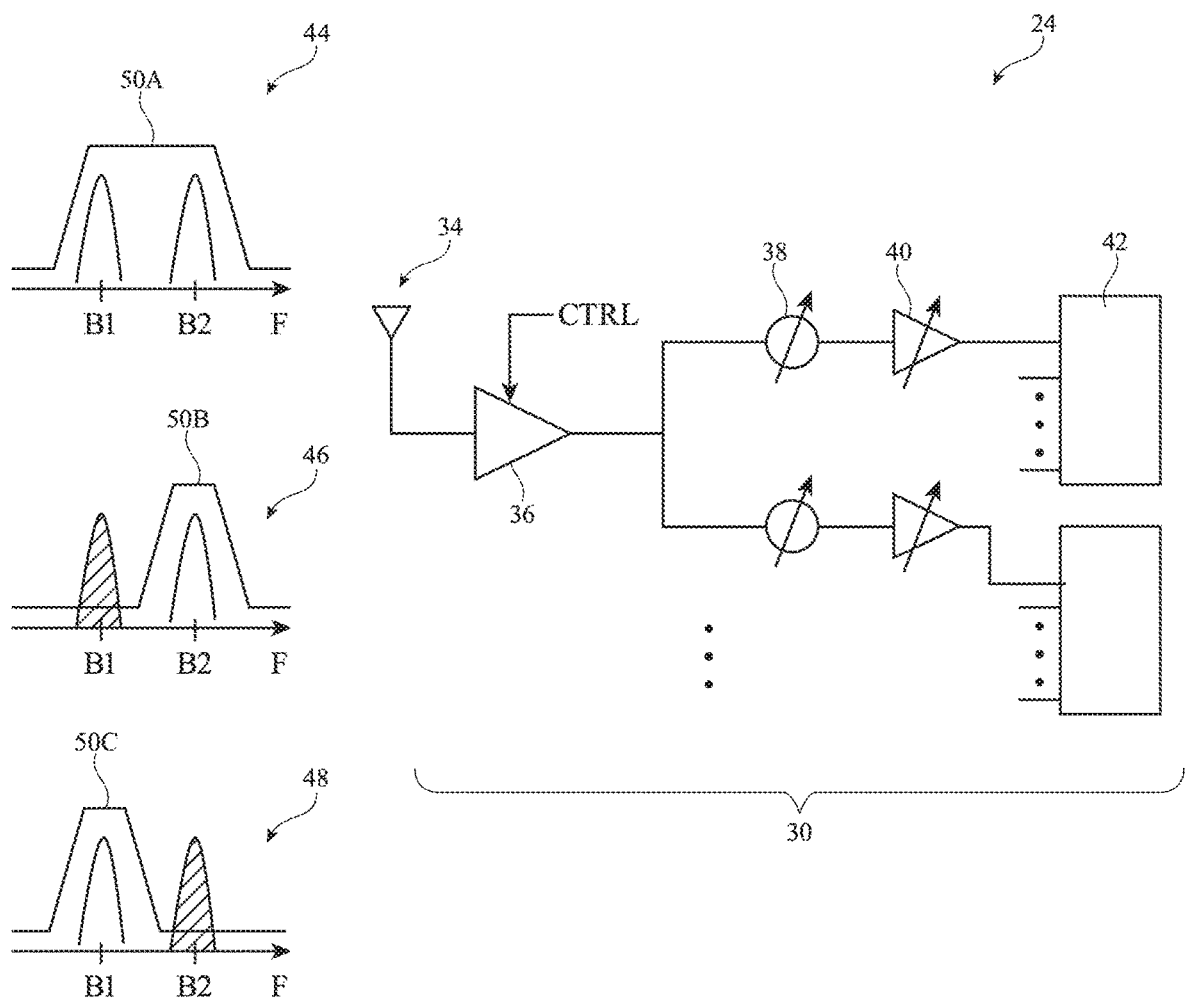
FIG. 2 is a diagram of illustrative wireless circuitry having front end circuitry adjustable between different operating modes for performing communications across first and second frequency bands or filtering out signal interference in one of the frequency bands in accordance with some embodiments.

FIG. 2 is a simplified schematic diagram showing one example of reconfigurable front end circuitry 30. As shown in FIG. 2, wireless circuitry 24 may include front end circuitry 30 coupled to a corresponding antenna 34. Front end circuitry 30 may include one or more low noise amplifiers such as low noise amplifier (LNA) 36. The input of LNA 36 may be coupled to antenna 34. The output of LNA 36 may be coupled to one or more receiver chains each with a corresponding phase and magnitude controller (e.g., for performing beam steering when antenna 34 is implemented in a phased antenna array). The phase and magnitude controllers may include phase shifters 38 and amplifiers (e.g., variable gain amplifiers) 40. The output of the phase and magnitude controllers may be coupled to one or more signal combiners 42. Signal combiners 42 may include one or more switches, filters, multiplexers, demultiplexers, couplers, etc.

Front end circuitry 30 may be adjustable (e.g., switchable or reconfigurable) between at least three different operating modes. Front end circuitry 30 may include an adjustable impedance matching network that is controlled to place front end circuitry 30 in a selected one of the three different operating modes at a given time. The adjustable impedance matching network may be a multi-coil transformer-based impedance matching network. In one implementation that is described herein as an example, the adjustable impedance matching network may be disposed within LNA 36. This is merely illustrative and, in general, the adjustable impedance matching network may be disposed elsewhere in front end circuitry 30 (e.g., between LNA 36 and antenna 34, between LNA 36 and phase shifter(s) 38, within amplifier(s) 40, etc.). The adjustable impedance matching network in LNA 36 may receive control signals CTRL (e.g., from control circuitry 14 of FIG. 1). Control signals CTRL may adjust one or more components of the adjustable impedance matching network to place LNA 36 and thus front end circuitry 30 in a selected one of the three different operating modes (states).

The operating modes (states) of LNA 36 and front end circuitry 30 may include a wideband operating mode, a first band rejection operating mode, and a second band rejection operating mode. In the wideband operating mode, control signals CTRL may control one or more components in the adjustable impedance matching network to configure the adjustable impedance matching network (and thus LNA 36) to exhibit a wideband transfer function 50A, as shown by plot 44 (plotting voltage as a function of frequency F). Wideband transfer function 50A may have a passband that encompasses both a first frequency band B1 and a second frequency band B2 at higher frequencies than the first frequency band. While in the wideband operating mode, the wideband transfer function 50A of the adjustable impedance matching network may allow front end circuitry 30 to concurrently convey radio-frequency signals in both first frequency band B1 and in second frequency band B2 (e.g., using an inter-band CA scheme). However, the presence of interference signals within the passband may degrade reception of the signal of interest.

In the first band rejection operating mode, control signals CTRL may control one or more components in the adjustable impedance matching network to configure the adjustable impedance matching network (and thus LNA 36) to exhibit a first band rejection transfer function 50B, as shown by plot 46. Transfer function 50B may have a passband that encompasses or overlaps second frequency band B2 and a stop band that encompasses or overlaps first frequency band B1. While in the first band rejection operating mode, the transfer function 50B of the adjustable impedance matching network may allow front end circuitry 30 to convey radio-frequency signals in second frequency band B2 while blocking (rejecting) undesirable interference signals in first frequency band B1. This may prevent the interference signals from leaking onto the radio-frequency signals in second frequency band B2 and degrading in-band signal sensitivity in second frequency band B2.

In the second band rejection operating mode, control signals CTRL may control one or more components in the adjustable impedance matching network to configure the adjustable impedance matching network (and thus LNA 36) to exhibit a second band rejection transfer function 50C, as shown by plot 48. Transfer function 50C may have a passband that encompasses or overlaps first frequency band B1 and a stop band that encompasses or overlaps second frequency band B2. While in the second band rejection operating mode, the transfer function 50C of the adjustable impedance matching network may allow front end circuitry 30 to convey radio-frequency signals in first frequency band B1 while blocking (rejecting) undesirable interference signals in first frequency band B2. This may prevent the interference signals from leaking onto the radio-frequency signals in first frequency band B1 and degrading in-band signal sensitivity in first frequency band B1. Control circuitry 14 may use control signals CTRL to switch front end circuitry 30 between the wideband operating mode, the first band rejection operating mode, and the second band rejection operating mode in real time as needed (e.g., based on the frequency bands of operation of wireless circuitry 24 and/or based on where interference signals are present in frequency at any given time).

Figure 3:
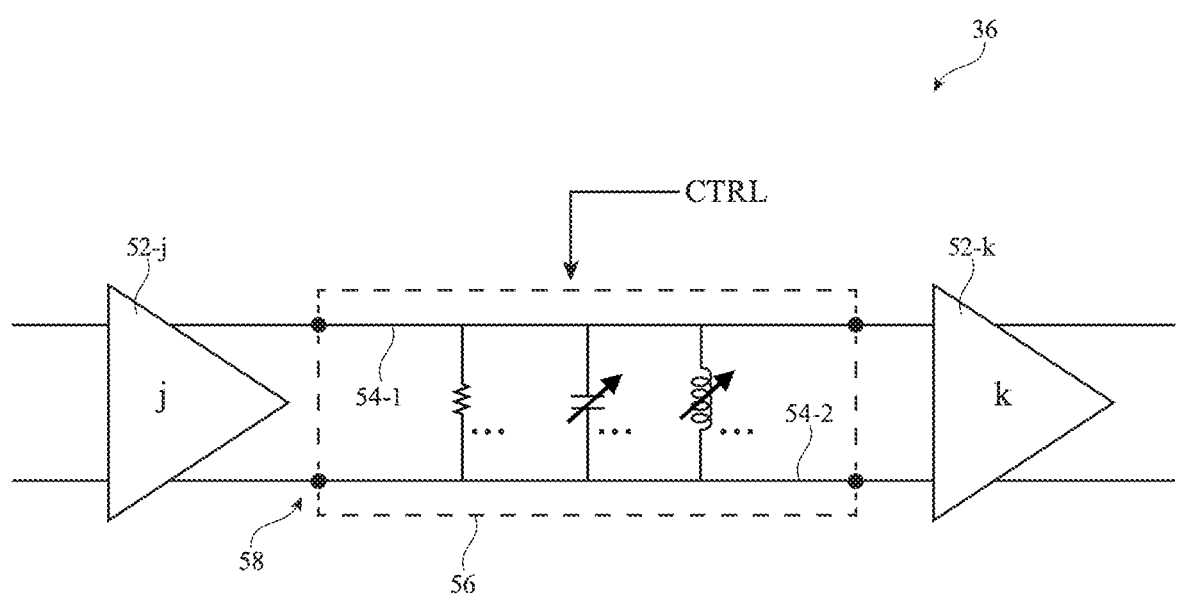
FIG. 3 is a schematic diagram of an illustrative low noise amplifier having an adjustable matching network in accordance with some embodiments.

FIG. 3 is a schematic diagram showing one example of how LNA 36 may include an adjustable impedance matching network. As shown in FIG. 3, LNA 36 may include one or more amplifier stages 52. For example, LNA 36 may include at least a jth stage 52-j having an output communicably coupled to the input of a subsequent kth stage 52-k. One or more signal paths (e.g., a differential signal path) such as signal paths 54-1 and 54-2 may couple the output of stage 52-j to the input of stage 52-k.

LNA 36 may include an adjustable impedance matching network such as adjustable impedance matching network 56. Adjustable impedance matching network 56 may include an input port 58 coupled to the output of stage 52-j (e.g., via a portion of signal paths 54-1 and 54-2) and may include an output port 60 coupled to the input of stage 52-k (e.g., via a portion of signal paths 54-1 and 54-2). Adjustable impedance matching network 56 may include one or more resistors, one or more capacitors, and/or one or more inductors operatively coupled to signal paths 54-1 and/or 54-2. Adjustable impedance matching network 56 may include one or more transformers formed from two or more of the inductors (coils). Adjustable impedance matching network 56 may, for example, include a multi-coil transformer having four inductors (coils). Adjustable impedance matching network 56 may therefore sometimes be referred to herein as transformer-based adjustable impedance matching network 56, transformer-based impedance matching network 56, multi-coil transformer-based adjustable impedance matching network 56, multi-coil transformer-based impedance matching network 56, adjustable impedance matching circuitry 56, impedance matching circuitry 56, transformer-based impedance matching circuitry 56, transformer-based adjustable impedance matching circuitry 56, or multi-coil transformer-based adjustable impedance matching circuitry 56.

The example of FIG. 3 in which adjustable impedance matching network 56 is interposed between amplifier stages 52-j and 52-k is merely illustrative. If desired, there may be no amplifier stage coupled to input port 58 and/or output port 60 (e.g., adjustable impedance matching network 56 may be coupled to the input of the first stage in LNA 36 or to the output of the last stage in LNA 36) or adjustable impedance matching network 56 may be disposed elsewhere in front end circuitry 30 (FIG. 2) (e.g., input port 58 and/or output port 60 may be coupled to radio-frequency transmission line path 32 (FIG. 1), input port 58 may be coupled to antenna 34, output port 60 may be coupled to LNA 36, input port 58 and/or output port 60 may be coupled to phase shifter 38 (FIG. 2), etc.).

In some implementations, the adjustable impedance matching network includes a switched capacitor and an inductor coupled in parallel between signal paths 54-1 and 54-2, with equivalent parallel resistances on either side of the switched capacitor and the inductor. In these implementations, the switched capacitor is adjusted to tune the resonance of the inductor and thus the frequency of interest to allow the adjustable impedance matching network to exhibit satisfactory rejection to interferences outside of the corresponding resonant band. However, such implementations do not allow for reception of signals in both frequency bands B1 and B2 simultaneously (e.g., does not allow for inter-band CA) due to its narrow bandwidth. In addition, the center frequency is sensitive to capacitor process variations and may require calibration or trimming. Further, the frequency tuning range exhibits a severe trade off with the Q factor of the switched capacitor, especially for millimeter wave frequencies.

In other implementations, the adjustable impedance matching network includes a transformer having only first and second magnetically-coupled inductors that are coupled between signal paths 54-1 and 54-2. A shunt LC notch filter (e.g., a series-coupled capacitor and inductor) is then coupled between signal paths 54-1 and 54-2, with equivalent parallel resistances and capacitances coupled between signal paths 54-1 and 54-2 on either side of the LC notch filter and transformer. This transformer exhibits a low magnetic coupling constant (factor) k as a fourth order network that provides wideband matching, where the LC notch filter is tuned to the frequency where interference presents. Such implementations may therefore allow for simultaneous signal reception in both frequency bands B1 and B2. However, the LC notch filter can load the transformer at the signal of interest if the notch frequency is not far away from in-band, the LC notch filter may lead to an undesirable increase in chip area consumed by the adjustable impedance matching network, and the LC notch filter covers an excessively narrow frequency range.

To mitigate these issues (e.g., allowing adjustable impedance matching network 56 to cover both frequency bands B1 and B2 while allowing the adjustable impedance matching network to dynamically filter out interference in either frequency band as needed, minimizing chip area, minimizing cost, minimizing complexity, and/or minimizing process variation), adjustable impedance matching network 56 may include a multi-coil transformer that is controlled to switch adjustable impedance matching network 56 between the wideband operating mode, the first band rejection operating mode, and the second band rejection operating mode.

Figure 4:
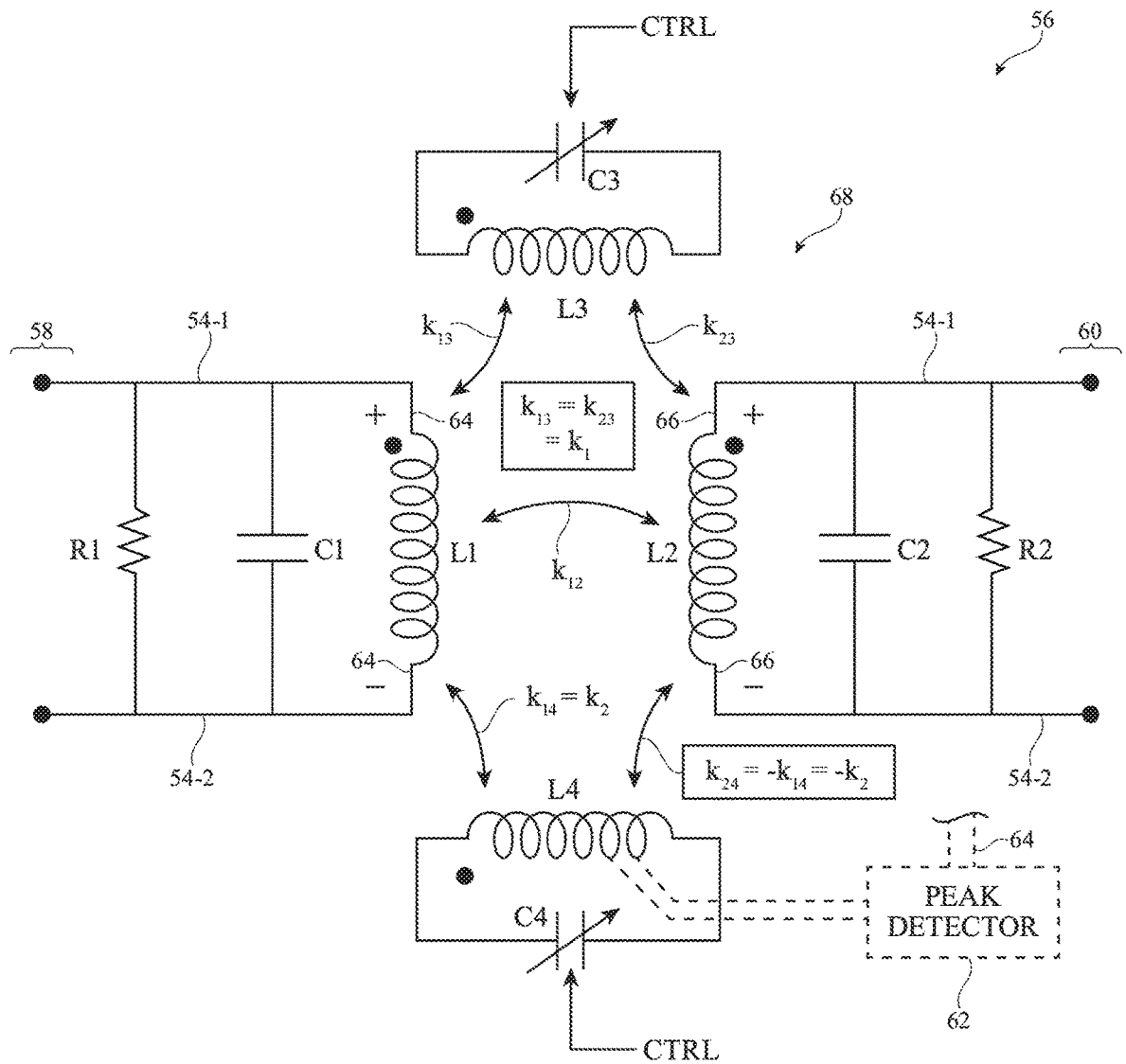
FIG. 4 is a circuit diagram of an illustrative multi-coil transformer in an adjustable matching network that may be switched between wideband, first band rejection, and second band rejection operating modes in accordance with some embodiments.

FIG. 4 is a circuit diagram showing how adjustable impedance matching network 56 may include a multi-coil transformer that is controlled to switch adjustable impedance matching network 56 between the wideband operating mode, the first band rejection operating mode, and the second band rejection operating mode. As shown in FIG. 4, adjustable impedance matching network 56 may have a multi-coil transformer 68 disposed along signal paths 54-1 and 54-2 between input port 58 and output port 60. Multi-coil transformer 68 may include more than two inductors.

For example, multi-coil transformer 68 may include a first inductor (coil) L1 having terminals 64 coupled to signal paths 54-1 and 54-2. Multi-coil transformer 68 may include a second inductor (coil) L2 having terminals 66 coupled to signal paths 54-1 and 54-2. First inductor L1 may be magnetically coupled to second inductor L2 via a magnetic coupling characterized by magnetic coupling constant (factor) $k_{12}$. Equivalent parallel resistance R1 and capacitance C1 may be coupled between signal paths 54-1 and 54-2 between input port 58 and first inductor L1. Equivalent parallel resistance R2 and capacitance C2 may be coupled between signal paths 54-1 and 54-2 between output port 60 and second inductor L2.

Multi-coil transformer 68 may include a third inductor (coil) L3. Third inductor L3 may have no electrical connection to signal paths 54-1 and 54-2. However, the terminals of third inductor L3 may be coupled to respective terminals (electrodes) of adjustable capacitor C3. Third inductor L3 and adjustable capacitor C3 may therefore be floating with respect to the signal path. Third inductor L3 may be magnetically coupled to first inductor L1 via a magnetic coupling characterized by magnetic coupling constant (factor) $k_{13}$. Third inductor L3 may also be magnetically coupled to second inductor L2 via a magnetic coupling characterized by magnetic coupling constant (factor) $k_{23}$.

Multi-coil transformer 68 may also include a fourth inductor (coil) L4. Fourth inductor L4 may have no electrical connection to signal paths 54-1 and 54-2. However, the terminals of fourth inductor L4 may be coupled to respective terminals (electrodes) of adjustable capacitor C4. Fourth inductor L4 and adjustable capacitor C4 may therefore be floating with respect to the signal path. Fourth inductor L4 may be magnetically coupled to first inductor L1 via a magnetic coupling characterized by magnetic coupling constant (factor) $k_{14}$. Fourth inductor L4 may also be magnetically coupled to second inductor L2 via a magnetic coupling characterized by magnetic coupling constant (factor) $k_{24}$.

Adjustable capacitors C3 and C4 may receive control signals CTRL (e.g., at control terminals or inputs of the adjustable capacitors). Adjustable capacitors C3 and C4 may, for example, be programmable/adjustable capacitors having capacitances that are adjusted using control signals CTRL. Control signals CTRL may be used to switch the operating mode of adjustable impedance matching network 56 by changing the capacitances of adjustable capacitors C3 and/or C4. In general, coupling constant $k_{12}$ between inductors L1 and L2 may allow multi-coil transformer 68 and thus adjustable impedance matching network 56 to exhibit wideband transfer function 50A (FIG. 2) when operated in the wideband operating mode. Magnetic coupling constants $k_{13}$, $k_{23}$, $k_{14}$, and $k_{24}$ may introduce zeroes at output 60 in the first and second band rejection operating modes.

For example, inductors L1, L3, and L2 may be configured such that the magnetic coupling constant $k_{13}$ between inductors L1 and L3 is equal to the magnetic coupling constant $k_{23}$ between inductors L2 and L3. Magnetic coupling constants $k_{13}$ and $k_{23}$ may therefore sometimes each be referred to herein as a first magnetic coupling constant $k_1$ (e.g., where $k_1 = k_{13} = k_{23}$). At the same time, inductors L1, L4, and L2 may be configured such that the magnetic coupling constant $k_{14}$ between inductors L1 and L4 is equal to the negative (inverse) of magnetic coupling constant $k_{24}$ between inductors L2 and L4 (e.g., where $k_{24} = -k_{14}$ or $k_{14} = -k_{24}$). Magnetic coupling constant $k_{14}$ may sometimes be referred to herein more simply as a second magnetic coupling constant $k_2$, where the magnetic coupling constant $k_{24}$ between inductors L2 and L4 is sometimes referred to herein as the negative/inverse of second magnetic coupling constant $k_2$ (e.g., where $k_{24} = -k_2$). Configuring magnetic coupling constants $k_{13}$, $k_{23}$, $k_{14}$, and $k_{24}$ in this way may allow adjustable impedance matching network 56 to achieve notch filtering in one frequency band (e.g., frequency band B1 or B2) without impacting the in-band signal in the other frequency band (e.g., frequency band B2 or B1) while operating in the first or second band rejection operating modes. Inductors L3, L4, L1, and/or L2 may be shaped and/or placed at locations relative to each other that are selected in such a way so as to configure the magnetic coupling constants to exhibit these values (e.g., to configure $k_{13}$ to be equal to magnetic coupling constant $k_{23}$ and to configure magnetic coupling constant $k_{14}$ to be equal to $-k_{24}$). Control signals CTRL may reconfigure adjustable capacitors C3 and C4 to switch adjustable impedance matching network 56 between operating modes and to tune the notch filtering frequency exhibited by the transfer function of adjustable impedance matching network 56.

If desired, an optional signal peak detector 62 may be disposed at one or more locations within adjustable impedance matching network 56 for detecting interference signals conveyed over signal paths 54-1 and 54-2. Peak detector 62 may, for example, be interposed on or coupled to locations within inductor L4 and/or may be interposed on or coupled to locations within third inductor L3 (e.g., via path 64). Peak detector 62 may process signals conveyed over signal paths 54-1 and 54-2 to detect the presence of interference signals in one or more frequency bands. For example, peak detector 62 may detect the presence and frequency of an interference signal on first frequency band B1 and/or on second frequency band B2. Control circuitry 14 (FIG. 1) may use information about the interference signal gathered by peak detector 62 to know when and how to adjust the operating mode of adjustable impedance matching network 56. For example, when no interference signal is detected, control circuitry 14 may place adjustable impedance matching network 56 in the wideband operating mode. When peak detector 62 detects an interference signal in first frequency band B1, control circuitry 14 may place adjustable impedance matching network 56 in the first band rejection mode and may optionally tune one of the adjustable capacitors so the transfer function rejects the interference signal in first frequency band B1. When peak detector 62 detects an interference signal in second frequency band B2, control circuitry 14 may place adjustable impedance matching network 56 in the second band rejection mode and may optionally tune one of the adjustable capacitors so the transfer function rejects the interference signal in second frequency band B2. This may allow wireless circuitry 24 to dynamically filter out interference signals while otherwise exhibiting as wide a bandwidth as possible (e.g., for performing inter-band CA).

Figure 5A:
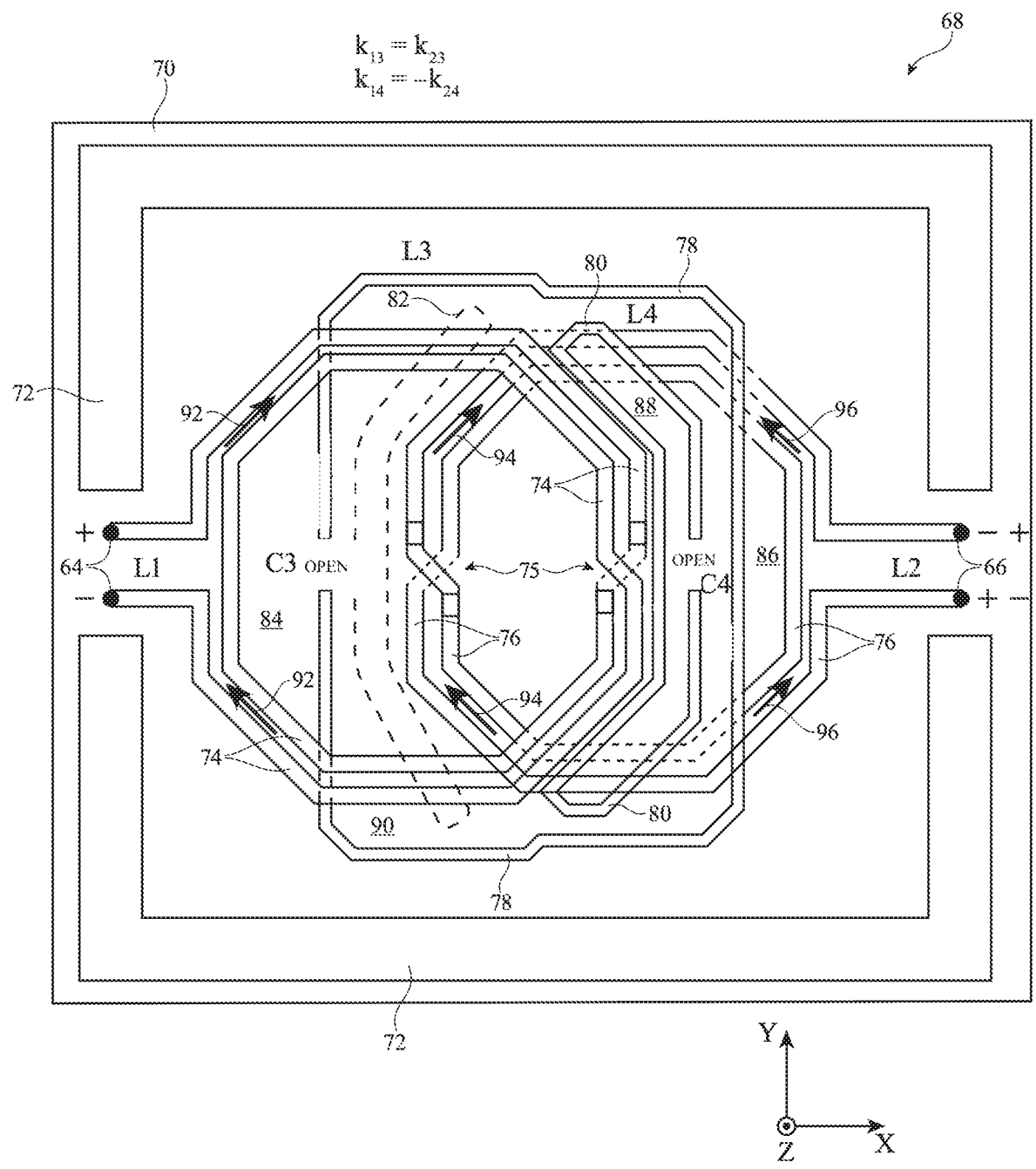
FIGS. 5A-C are layout diagrams of an illustrative multi-coil transformer that may be switched between wideband, first band rejection, and second band rejection operating modes in accordance with some embodiments.
Figure 5B:
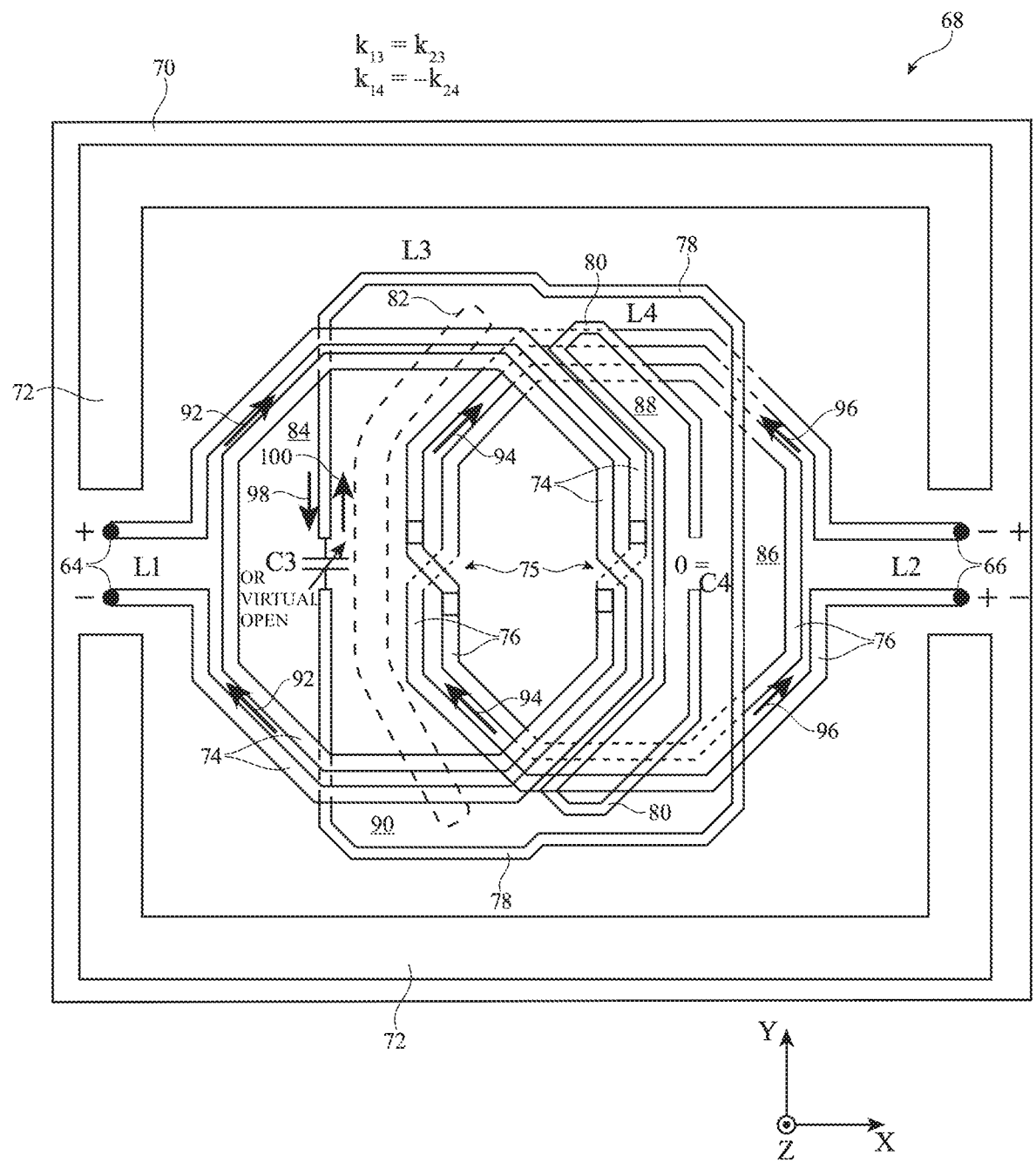
Figure 5C:
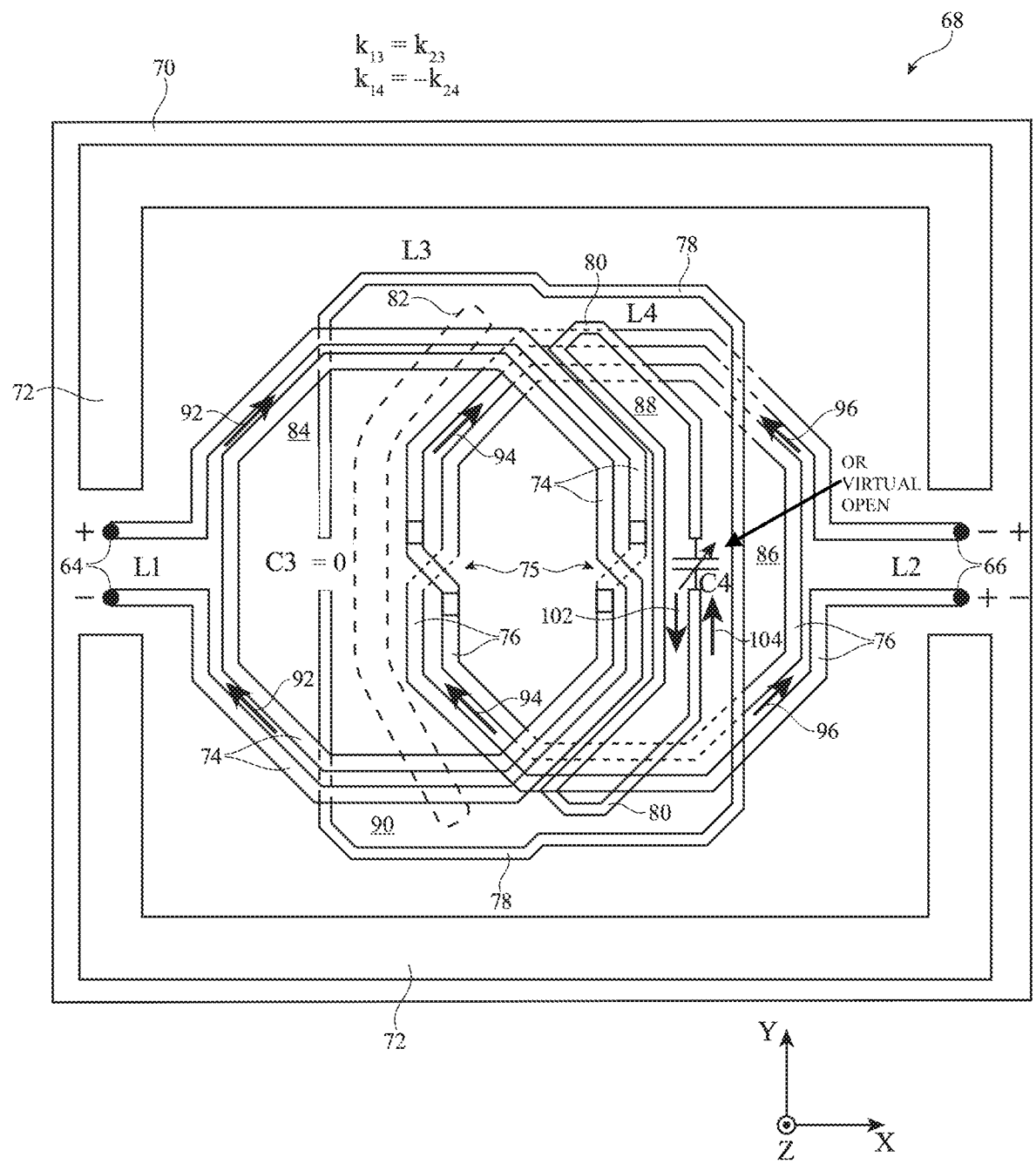

FIGS. 5A-C are top-down layout diagrams of multi-coil transformer 68. As shown in FIGS. 5A-C, multi-coil transformer 68 may be formed on a dielectric substrate such as dielectric substrate 70. Dielectric substrate 70 may, for example, include multiple vertically-stacked dielectric layers (e.g., dielectric layers that are stacked in the direction of the Z-axis of FIGS. 5A-C). First inductor L1 may be formed from first conductive traces 74 on dielectric substrate 70. Second inductor L2 may be formed from second conductive traces 76 on dielectric substrate 70. Third inductor L3 may be formed from third conductive traces 78 on dielectric substrate 70. Fourth inductor L4 may be formed from fourth conductive traces 80 on dielectric substrate 70.

As one example, third conductive traces 78 and fourth conductive traces 80 may be patterned onto a first layer of dielectric substrate 70 (e.g., within a first metallization layer), first conductive traces 74 may be patterned onto a second layer of dielectric substrate 70 (e.g., within a second metallization layer), and second conductive traces 76 may be patterned onto a third layer of dielectric substrate 70 (e.g., within a third metallization layer, where the second metallization layer is interposed between the first and third metallization layers). In this example, first inductor L1 may also include conductive vias and conductive traces on the second and/or third metallization layers that allow first inductor L1 to overlap one or more of inductors L2-L4 without contacting the conductive material in inductors L2-L4 and/or to allow any one of inductors L1-L4 to coil more than once around its respective opening (e.g., at cross-over points 75). This example is merely illustrative and, in general, inductors L1-L4 may be disposed on any desired number of two or more layers in dielectric substrate 70, one or more of the inductors may be distributed across two or more of the layers in dielectric substrate 70, and the layers may be disposed in any order in dielectric substrate 70 (e.g., different relative positioning between inductors L1-L4 along the Z-axis may be used).

Conductive ground traces such as ground traces 72 may be patterned onto dielectric substrate 70. Ground traces 72 may laterally surround multi-coil transformer 68. If desired, ground traces 72 may be patterned on two or more layers of dielectric substrate 70. In these examples, conductive vias may couple the ground traces on each of the layers together. Ground traces 72 may be held at a reference potential and may help to electromagnetically shield multi-coil transformer 68.

First conductive traces 74 in first inductor L1 may follow a loop or coil (e.g., spiral) path that wraps, runs, extends, or coils at least once around a first opening 84. Second conductive traces 76 in second inductor L2 may follow a loop or coil (e.g., spiral) path that wraps, runs, extends, or coils at least once around a second opening 86. Third conductive traces 78 in third inductor L3 may follow a loop or coil (e.g., spiral) path that wraps, runs, extends, or coils at least once around a third opening 90. Fourth conductive traces 70 in fourth inductor L4 may follow a loop or coil (e.g., spiral) path that wraps, runs, extends, or coils at least once around a fourth opening 88.

The layout and relative placement of conductive traces 74-80 may be selected to configure the magnetic coupling constant $k_{13}$ between conductive traces 74 and 78 (e.g., between inductors L1 and L3) to be equal to the magnetic coupling constant $k_{23}$ between conductive traces 76 and 78 (e.g., between inductors L2 and L3). At the same time, the layout and relative placement of conductive traces 74-80 may be selected to configure the magnetic coupling constant $k_{14}$ between conductive traces 74 and 80 (e.g., between inductors L1 and L4) to be equal to the negative of the magnetic coupling constant $k_{24}$ between conductive traces 76 and 80 (e.g., between inductors L2 and L4).

For example, as shown in FIGS. 5A-C, first conductive traces 74 of first inductor L1 may at least partially overlap second conductive traces 76 of second inductor L2 (e.g., opening 84 of first inductor L1 may at least partially overlap opening 86 of second inductor L2). At the same time, fourth conductive traces 80 in fourth inductor L4 may at least partially overlap second conductive traces 76 in second inductor L2 without overlapping first conductive traces 74 in first inductor L1 (e.g., opening 88 of fourth inductor L4 may overlap opening 86 of second inductor L2 without overlapping opening 84 of first inductor L1). In addition, third conductive traces 78 in third inductor L3 may at least partially overlap first conductive traces 74 in first inductor L1, second conductive traces 76 in second inductor L2, and fourth conductive traces 80 in fourth inductor L4 (e.g., opening 90 of third inductor L3 may at least partially overlap opening 84 of first inductor L1, may at least partially overlap opening 86 of second inductor L2, and may overlap an entirety of fourth inductor 14 and/or opening 88 in fourth inductor L4).

When arranged in this way, inductors L1 and L2 form weakly coupled transformers having magnetic coupling constant $k_{12}$. Third inductor L3 shares a common magnetic flux with inductors L1 and L2, thereby achieving the same coupling polarity (e.g., configuring magnetic coupling constant $k_{13}$ between inductors L1 and L3 to have the same polarity as magnetic coupling constant $k_{23}$ between inductors L2 and L3). The amount of overlap between opening 90 of third inductor L3 and opening 84 of first inductor L1 and the amount of overlap between opening 90 of third inductor L3 and opening 86 of second inductor L2 then configures the magnetic coupling constant $k_{13}$ between inductors L1 and L3 to be equal to the magnetic coupling constant $k_{23}$ between inductors L2 and L3 (e.g., equalizing the desired coupling strength). On the other hand, fourth inductor L4 is wound once inside second inductor L2 (e.g., overlapping opening 86 of second inductor L2) and outside first inductor L1 (e.g., without overlapping opening 84 of first inductor L1), thereby achieving opposite coupling polarity with the same coupling strength (e.g., configuring magnetic coupling constant $k_{14}$ between inductors L1 and L4 to have opposite polarity but the same strength/magnitude as the magnetic coupling constant $k_{24}$ between inductors L2 and L4).

The layout shown in FIGS. 5A-C is merely illustrative. In general, conductive traces 74-80 may have any desired shapes (e.g., having any desired number of straight and/or curved segments) and any desired relative positioning (e.g., where the opening of each of inductors L1-L4 at least partially overlaps the opening of one or more of the other inductors and/or does not overlap the opening of any of the other inductors in multi-coil transformer 68). As just one example, fourth conductive traces 80 and thus fourth inductor L4 may overlap first inductor L1 but not second inductor L2 (e.g., fourth inductor L4 may be disposed at location 82 such that opening 88 in fourth inductor 14 overlaps opening 84 in first inductor L1, an entirety of opening 88 in fourth inductor L4 overlaps opening 90 in third inductor L3, and opening 88 in fourth inductor L4 does not overlap any of opening 86 in second inductor L2).

Terminals 64 of first inductor L1 may be coupled to input port 58 and terminals 66 of second inductor L2 may be coupled to output port 60 of adjustable impedance matching network 56 (FIG. 4). First conductive traces 74 in first inductor L1 may extend between terminals 64. Second conductive traces 76 in second inductor L2 may extend between terminals 66. Adjustable capacitor C3 may be coupled between opposing ends of third conductive traces 78. Adjustable capacitor C4 may be coupled between opposing ends of fourth conductive traces 80. Adjustable capacitors C3 and C4 may be varactors, surface-mount capacitors that are soldered to substrate 70, distributed adjustable capacitors, or any other desired adjustable/programmable capacitances. Adjustable capacitors C3 and C4 may receive control signals CTRL (FIG. 4) to switch adjustable impedance matching network 56 between the wideband, first band rejection, and second band rejection operating modes.

Figure 6:
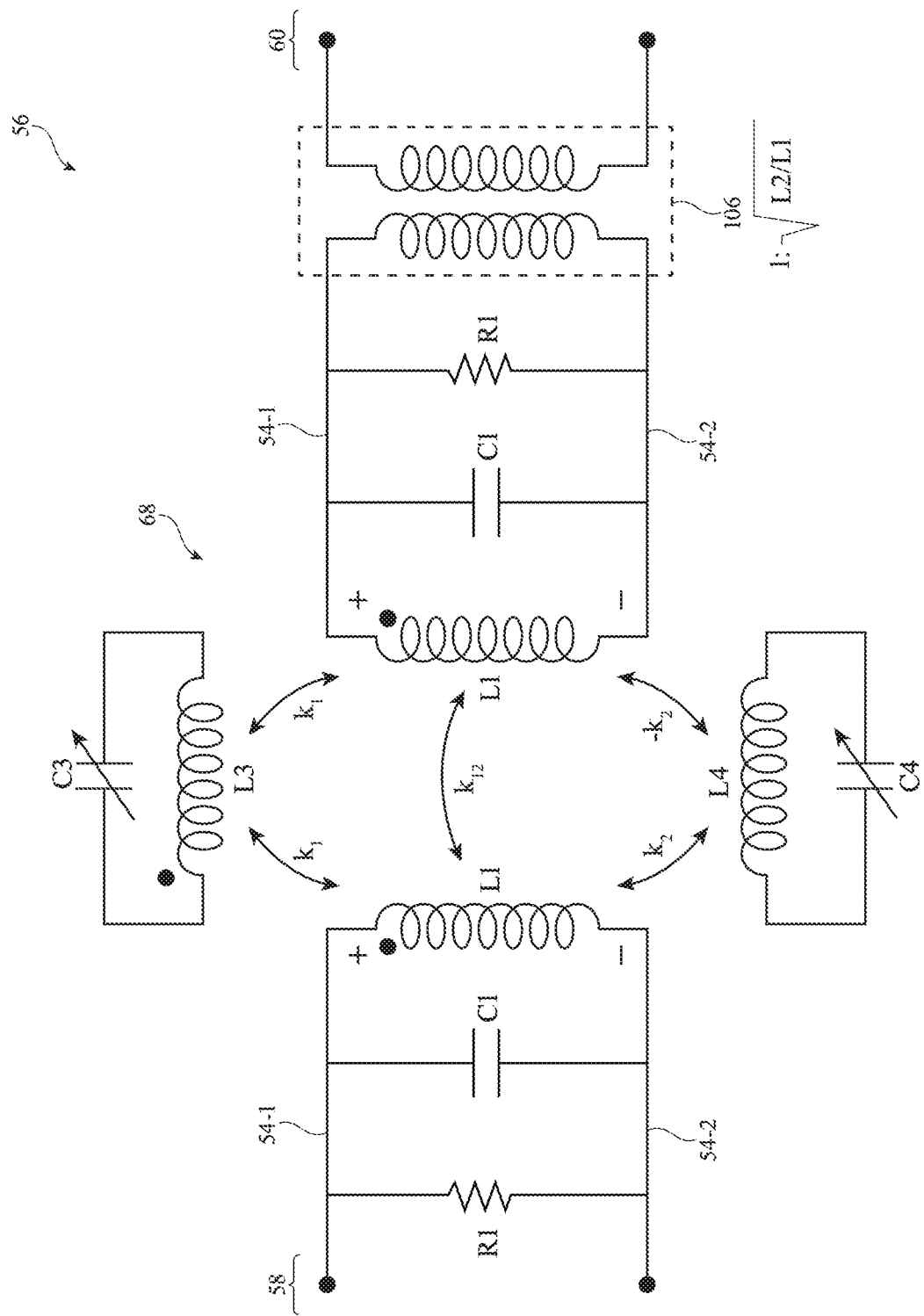
FIG. 6 is a circuit diagram showing how the illustrative multi-coil transformer of FIG. 4 may be represented by a balanced input/output impedance network followed by an ideal impedance transformer in accordance with some embodiments.

Multi-stage amplifier design generally involves progressively increasing device size towards the last stage to maximize output power and linearity. This assumption may allow multi-coil transformer 68 to be equivalently represented as a balanced input/output impedance network followed by an ideal impedance transformer. FIG. 6 is a diagram of multi-coil transformer 68 when represented as a balanced input/output impedance network followed by an ideal impedance transformer for the sake of simplicity.

As shown in FIG. 6, when assuming that LNA 36 includes progressively increasing device size towards its last stage 52, a scaling factor m can be defined such that C2 (FIG. 4) can be written as C2=m*C1, such that R2 (FIG. 4) can be written as R2=R1/m, and such that L2 (FIG. 4) can be written as L2=L1/m. The inductors, resistors, and capacitors in FIG. 3 have been rewritten in the simplified representation of FIG. 6 to account for this assumption, modeling multi-coil impedance transformer 68 as including two inductors L1 that exhibit magnetic coupling coefficient $k_{12}$ (instead of a first inductor L1 and a second inductor L2), followed by capacitance C1 and R1 between signal paths 54-1 and 54-2 and then an ideal impedance transformer 106 at output port 60. This simplification will be applied to illustrate the operation of adjustable impedance matching network 56 below for the sake of simplicity.

Figure 7:
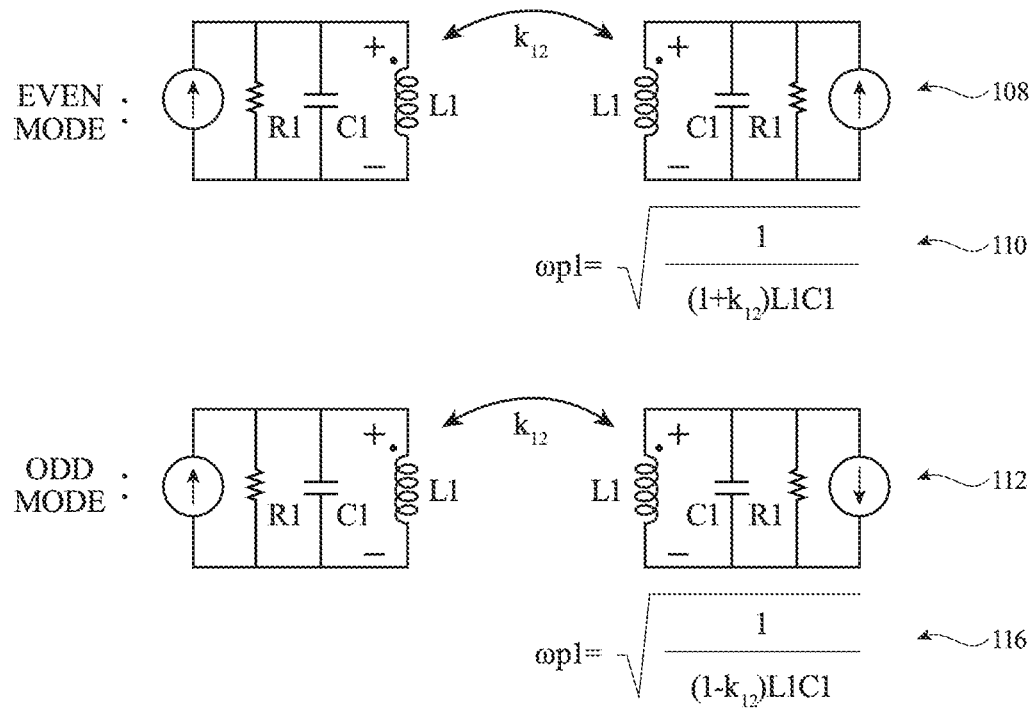
FIG. 7 is a diagram showing how an illustrative multi-coil transformer placed in a wideband operating mode may be decomposed into even and odd modes for performing communications across first and second frequency bands in accordance with some embodiments.

FIG. 7 shows simplified equivalent circuit diagrams illustrating the effective electrical operation of multi-coil transformer 68 in the wideband operating mode. In the wideband operating mode, control circuitry 14 (FIG. 1) may use control signal CTRL to turn (switch) off adjustable capacitor C3 (FIG. 5A, which illustrates the wideband operating mode). This forms an open circuit in third inductor L3 at the location of adjustable capacitor C3, configuring third inductor L3 to form an open loop such that no current is induced on third inductor L3 by inductors L1 and L2. Control circuitry 14 may also use control signal CTRL to turn (switch) off adjustable capacitor C4. This forms an open circuit in fourth inductor L4 at the location of adjustable capacitor C4, configuring fourth inductor L4 to form an open loop such that no current is induced on fourth inductor L4 by inductors L1 and L2.

Current from signal paths 54-1 and 54-2 may flow through first inductor L1 between terminals 64 in a first (e.g., clockwise) direction, as shown by arrows 92 of FIG. 5. The operation of multi-coil transformer 68 may be decomposed into an even mode and an odd mode (e.g., an even mode excitation and an odd mode excitation). In the even mode, current flows through second inductor L2 between terminals 66 in the first (e.g., clockwise) direction, as shown by arrows 94 of FIG. 5A. At the same time, in the odd mode, current flows through second inductor L2 between terminals 66 in a second (e.g., counterclockwise) direction opposite the first direction, as shown by arrows 96 of FIG. 5A.

Equivalent circuit diagram 108 of FIG. 7 illustrates the even mode excitation of multi-coil transformer 68 when placed in the wideband operating mode (e.g., using the simplification assumptions of FIG. 6). Equivalent circuit diagram 112 illustrates the odd mode excitation of multi-coil transformer 68 when placed in the wideband operating mode (e.g., having a current source coupled to the second inductor with opposite polarity relative to the even mode). The multi-coil transformer may form a fourth order matching network having a first pole produced by the even mode excitation at a first angular frequency $\omega p1$ and having a second pole produced by the odd mode excitation at a second angular frequency $\omega p2$. Equation 110 of FIG. 7 defines first angular frequency $\omega p1$ as a function of L1 (e.g., the inductance of first inductor L1) and C1 (e.g., the capacitance of capacitor C1). Equation 116 of FIG. 7 defines second angular frequency $\omega p2$ as a function of L1 and C1.

Figure 8:
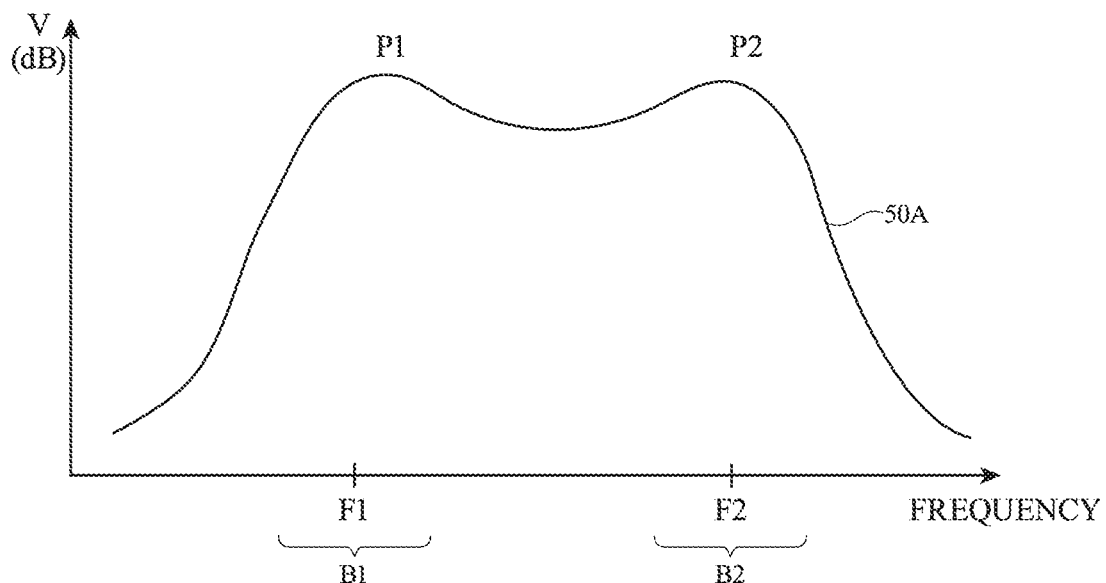
FIG. 8 is a plot of the transfer function of an illustrative multi-coil transformer placed in a wideband operating mode in accordance with some embodiments.

FIG. 8 is a plot of the transfer function 50A of adjustable impedance matching network 56 while in the wideband operating mode (in voltage V as a function of frequency). As shown in FIG. 8, transfer function 50A may exhibit a first peak (pole) P1 at a frequency corresponding to first angular frequency $\omega p1$. Transfer function 50A may also exhibit a second peak (pole) P2 at a frequency corresponding to second angular frequency $\omega p2$. As angular frequencies $\omega p1$ and $\omega p2$ are a function of L1 and C1 (e.g., as shown by equations 110 and 116 of FIG. 7), the magnitude of L1 (e.g., the inductance of first inductor L1) and C1 (e.g., the capacitance of capacitor C1) may be selected to tune the frequency of pole P1 to align with a frequency F1 in first frequency band B1 and to tune the frequency of pole P2 to align with a frequency F2 in second frequency band B2. This may allow adjustable impedance matching network 56 to receive or transmit in both bands B1 and B2 simultaneously (e.g., using inter-band CA).

Figure 9:
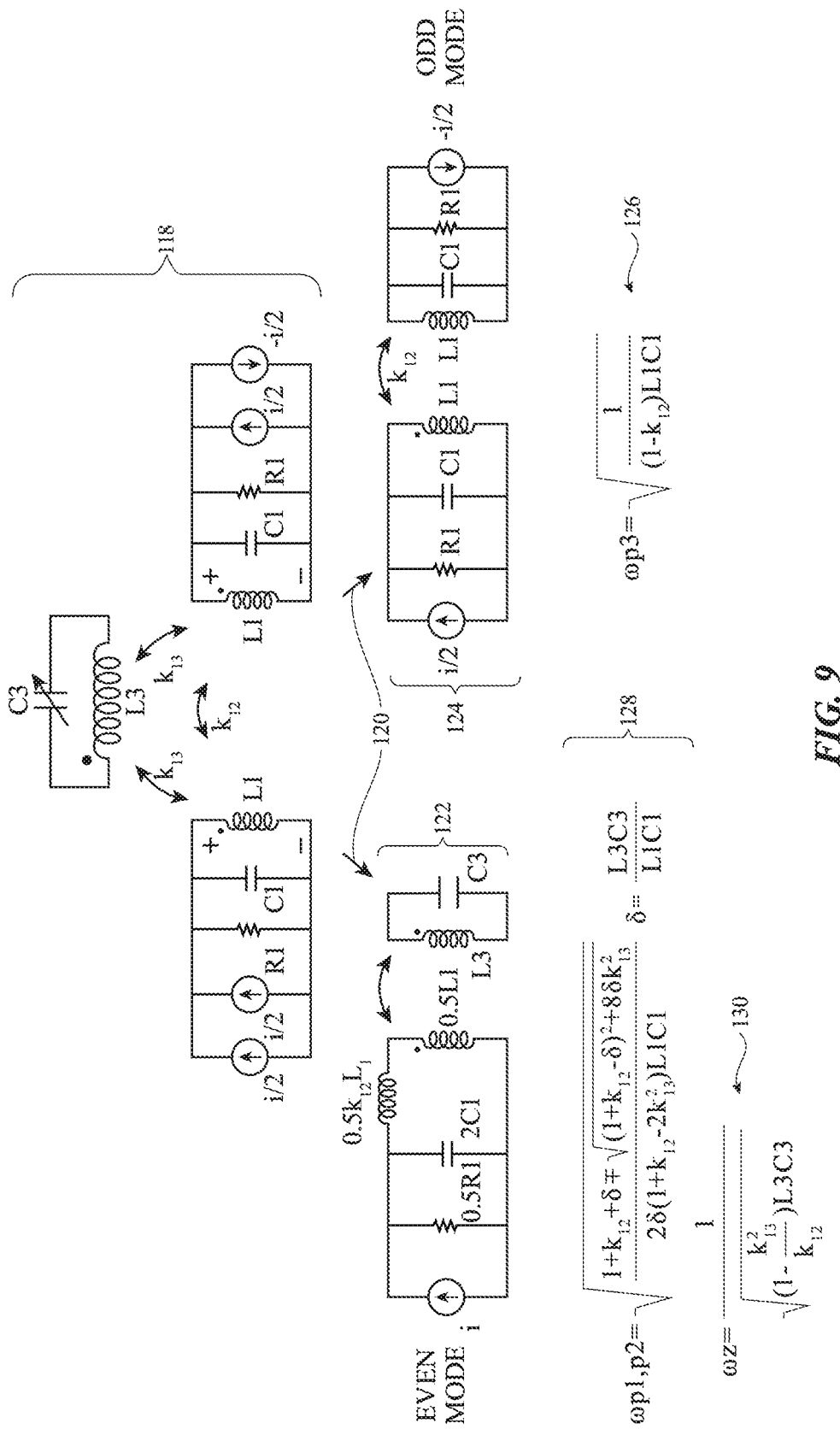
FIG. 9 is a diagram showing how an illustrative multi-coil transformer placed in a first band rejection operating mode may be decomposed into even and odd modes for performing communications in a second frequency band while rejecting interference in a first frequency band in accordance with some embodiments.

FIG. 9 shows simplified equivalent circuit diagrams illustrating the effective electrical operation of multi-coil transformer 68 in the first band rejection mode. In the first band rejection mode, control circuitry 14 (FIG. 1) may use control signal CTRL to turn (switch) off adjustable capacitor C4 (FIG. 5B, which illustrates the first band rejection mode). This forms an open circuit in fourth inductor L4 at the location of adjustable capacitor C4 (e.g., C4=0), configuring fourth inductor L4 to form an open loop such that no current is induced on fourth inductor L4 by inductors L1 and L2. As such, fourth inductor L4 does not affect the transfer function of adjustable impedance matching network 56 in the first band rejection mode.

At the same time, control circuitry 14 may use control signal CTRL to configure adjustable capacitor C3 to exhibit a first capacitance value (e.g., a capacitance value that does not form an open circuit). In the even mode, current flows through first inductor L1 between terminals 64 in the first (e.g., clockwise) direction, as shown by arrows 92 of FIG. 5B. Current also flows through second inductor L2 between terminals 66 in the first direction, as shown by arrows 94 of FIG. 5B. First inductor L1 and second inductor L2 may both induce current on third inductor L3 with the same polarity. For example, first inductor L1 and second inductor L2 may both induce current on third inductor L3 in the second (e.g., counterclockwise) direction, as shown by arrow 98 of FIG. 5B. The first capacitance value of adjustable capacitor C3 may tune the response of multi-coil transformer 68 to introduce a zero at output port 60 at a frequency that is selected to reject an interference signal present in the first frequency band B1.

In the odd mode, current flows through first inductor L1 in the first (e.g., clockwise) direction, as shown by arrows 92 of FIG. 5B. Current flows through second inductor L2 in the second (e.g., counterclockwise) direction, as shown by arrows 96 of FIG. 5B. Inductors L1 and L2 may thereby induce the same magnitude of current on third inductor L3 but with opposite polarity. For example, the current on first inductor L1 may induce current on third inductor L3 that flows in the second (e.g., counterclockwise) direction, as shown by arrow 98, whereas the current on second inductor L2 induces current of equal magnitude on third inductor L3 but that flows in the first (e.g., clockwise) direction, as shown by arrow 100. The current induced on third inductor L3 by first inductor L1 will thereby cancel out the current induced on third inductor L3 by second inductor L2, causing adjustable capacitor C3 to form a virtual open circuit in the odd mode. This may cause third inductor L3 to be transparent to current induced by inductors L1 and L2 in the second frequency band B2. In this way, any interference signal in first frequency band B1 can be nulled or rejected without affecting the gain of the signal of interest in second frequency band B2.

Equivalent circuit diagram 118 of FIG. 9 illustrates the operation of multi-coil transformer 68 in the first band rejection mode. As shown by equivalent circuit diagram 118, fourth inductor L4 does not affect the response of the transformer because an open circuit is formed in fourth inductor L4 by adjustable capacitor C4. As shown by arrows 120 of FIG. 9, the circuit may be decomposed into an even mode, shown by equivalent circuit diagram 122, and an odd mode, shown by equivalent circuit diagram 124. The even mode may produce a first peak (pole) at a first angular frequency $\omega p1$ and a second peak (pole) at a second angular frequency $\omega p2$, which are defined by equations 128. The even mode may also produce a zero or null at a zero angular frequency $\omega z$, which is defined by equation 130. Note that the zero angular frequency is only a function of magnetic coupling constant $k_{13}$, magnetic coupling constant $k_{12}$, the inductance of third inductor L3, and the capacitance of adjustable capacitor C3, and is independent of L1 and C1. At the same time, the odd mode may produce a third peak (pole) at a third angular frequency $\omega p3$, which is defined by equation 126. This pole is at a relatively high frequency and has a gain not affected by the notch filter.

Figure 10:
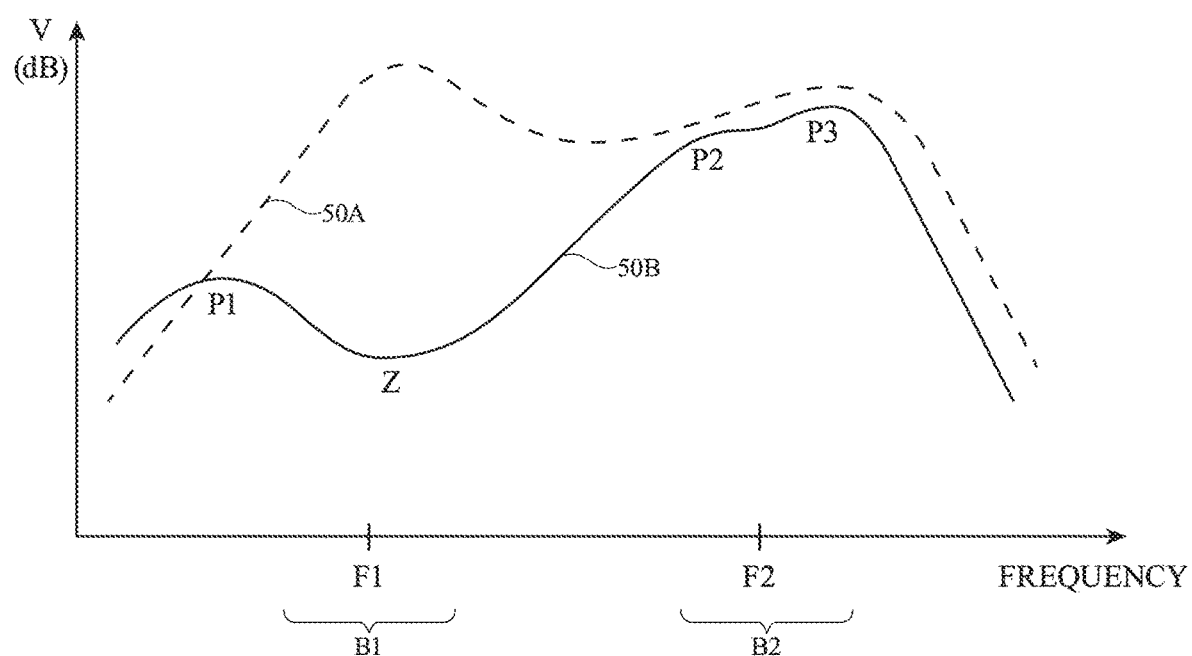
FIG. 10 is a plot of the transfer function of an illustrative multi-coil transformer placed in a first band rejection operating mode in accordance with some embodiments.

FIG. 10 is a plot of the transfer function 50B of adjustable impedance matching network 56 while in the first band rejection operating mode (in voltage V as a function of frequency). As shown in FIG. 10, transfer function 50B may exhibit a first peak (pole) P1, a second peak (pole) P2, and a third peak (pole) P3. The frequency of first pole P1 corresponds to first angular frequency ωp1 and the frequency of second pole P2 corresponds to second angular frequency ωp2, as defined by equations 128 of FIG. 9. The frequency of third pole P3 corresponds to third angular frequency ωp3, as defined by equation 126 of FIG. 9. Transfer function 50B may also exhibit a zero Z. The frequency of zero Z corresponds to zero angular frequency ωz, as defined by equation 130 of FIG. 9.

Poles P1 and P2 may be shaped by selecting corresponding inductances and capacitances for inductors L1 and L3 and capacitors C1 and C3 (e.g., as shown by equations 128). Pole P3 may be shaped by selecting a corresponding inductance and capacitance for first inductor L1 and capacitor C1 (e.g., as shown by equation 126). Zero Z may be shaped by selecting a corresponding inductance and capacitance for third inductor L3 and adjustable capacitor C3. Poles P1, P2, and P3 and zero Z may be shaped to align zero Z with a frequency F1 in first frequency band B1 and to align poles P2 and P3 with second frequency band B2. This may configure adjustable impedance matching network 56 to receive or transmit in second frequency band B2 while blocking interference signals in first frequency band B1.

Figure 11:
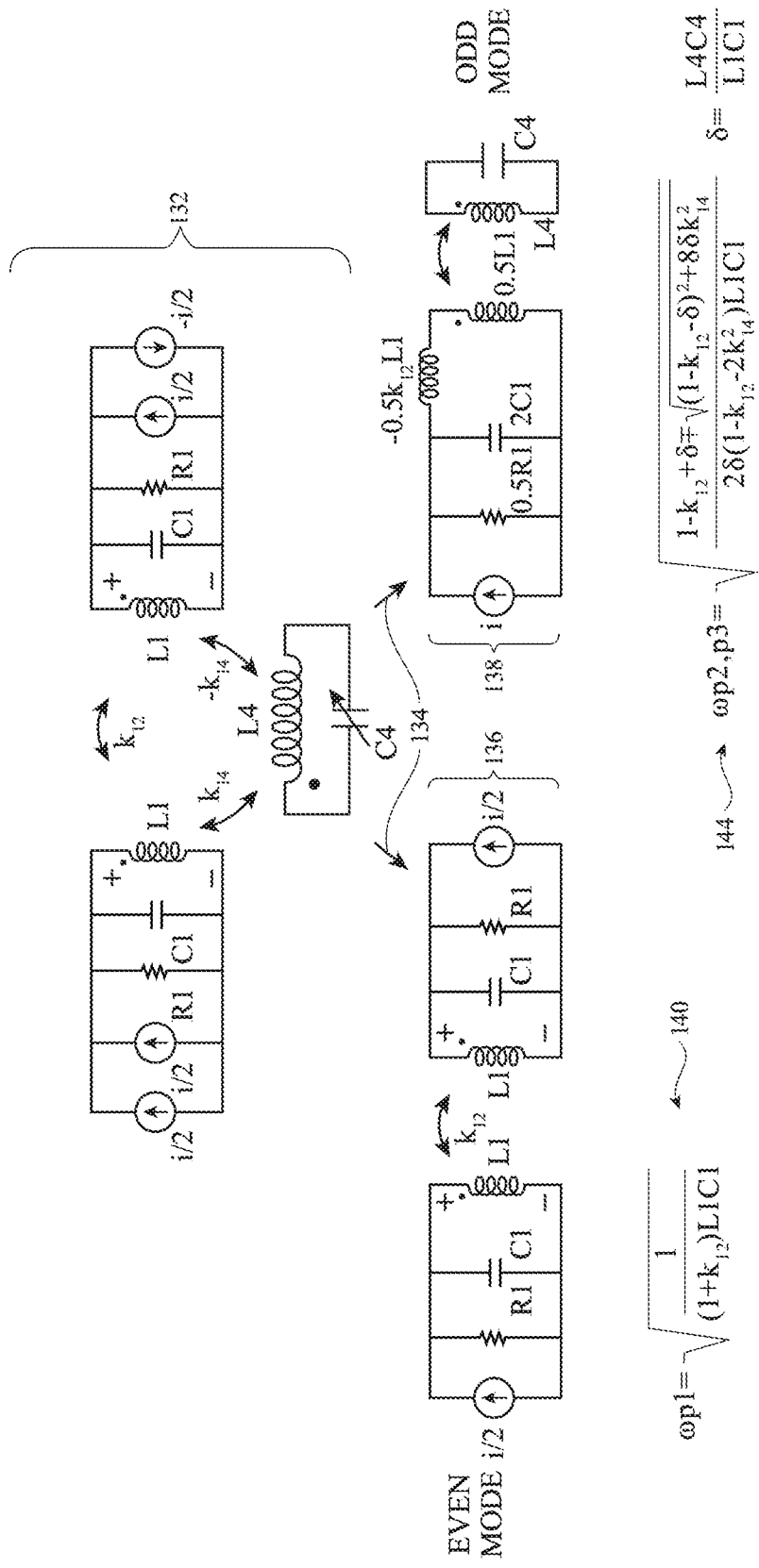
FIG. 11 is a diagram showing how an illustrative multi-coil transformer placed in a second band rejection operating mode may be decomposed into even and odd modes for performing communications in a first frequency band while rejecting interference in a second frequency band in accordance with some embodiments.

FIG. 11 shows simplified equivalent circuit diagrams illustrating the effective electrical operation of multi-coil transformer 68 in the second band rejection mode. In the second band rejection mode, control circuitry 14 (FIG. 1) may use control signal CTRL to turn (switch) off adjustable capacitor C3 (FIG. 5C, which illustrates the second band rejection mode). This forms an open circuit in third inductor L3 at the location of adjustable capacitor C3 (e.g., C3=0), configuring third inductor L3 to form an open loop such that no current is induced on third inductor L3 by inductors L1 and L2. As such, third inductor L3 does not affect the transfer function of adjustable impedance matching network 56 in the second band rejection mode. At the same time, control circuitry 14 may use control signal CTRL to configure adjustable capacitor C4 to exhibit a second capacitance value (e.g., a capacitance value that does not form an open circuit).

In the odd mode, current flows through first inductor L1 in the first (e.g., clockwise) direction, as shown by arrows 92 of FIG. 5C. Current flows through second inductor L2 in the second (e.g., counterclockwise) direction, as shown by arrows 96 of FIG. 5C. First inductor L1 and second inductor L2 may both induce current on fourth inductor L4, which overlaps second inductor L2 but not first inductor L1, with the same polarity. For example, first inductor L1 and second inductor L2 may both induce current on fourth inductor L4 in the first (e.g., clockwise) direction, as shown by arrow 102 of FIG. 5C. The second capacitance value of adjustable capacitor C4 may be selected to tune the response of multi-coil transformer 68 to introduce a zero at output port 60 at a frequency that is selected to reject an interference signal present in the second frequency band B2.

In the even mode, current flows through first inductor L1 between terminals 64 in the first (e.g., clockwise) direction, as shown by arrows 92 of FIG. 5C. Current also flows through second inductor L2 between terminals 66 in the first direction, as shown by arrows 94 of FIG. Inductors L1 and L2 may thereby induce the same magnitude of current on fourth inductor L4 but with opposite polarity. For example, the current on first inductor L1 may induce current on fourth inductor L4 that flows in the first (e.g., clockwise) direction, as shown by arrow 102 of FIG. 5C, whereas the current on second inductor L2 induces current of equal magnitude on fourth inductor L4 but that flows in the second (e.g., counterclockwise) direction, as shown by arrow 104 of FIG. 5C. The current induced on fourth inductor L4 by first inductor L1 will thereby cancel out the current induced on fourth inductor L4 by second inductor L2, causing adjustable capacitor C4 to form a virtual open circuit in the even mode. This may cause fourth inductor L4 to be transparent to current induced by inductors L1 and L2 in the first frequency band B1. In this way, any interference signal in second frequency band B2 can be nulled or rejected without affecting the gain of the signal of interest in first frequency band B1.

Equivalent circuit diagram 132 of FIG. 11 illustrates the operation of multi-coil transformer 68 in the second band rejection mode. As shown by equivalent circuit diagram 132, third inductor L3 does not affect the response of the transformer because an open circuit is formed in third inductor L3 by adjustable capacitor C3. As shown by arrows 134 of FIG. 11, the circuit may be decomposed into an even mode, shown by equivalent circuit diagram 136, and an odd mode, shown by equivalent circuit diagram 138. The even mode may produce a first peak (pole) at a first angular frequency ωp1, which is defined by equation 140. This pole is at a relatively low frequency and has a gain not affected by the notch filter. The even mode may also produce a zero or null at a zero angular frequency ωz, which is defined by equation 142. Note that the zero angular frequency is only a function of magnetic coupling constant $k_{14}$, magnetic coupling constant $k_{12}$, the inductance of fourth inductor L4, and the capacitance of adjustable capacitor C4, and is independent of L1 and C1. At the same time, the odd mode may produce a second peak (pole) at a second angular frequency ωp2 and a third peak (pole) at a third angular frequency ωp3, which are defined by equations 144.

Figure 12:
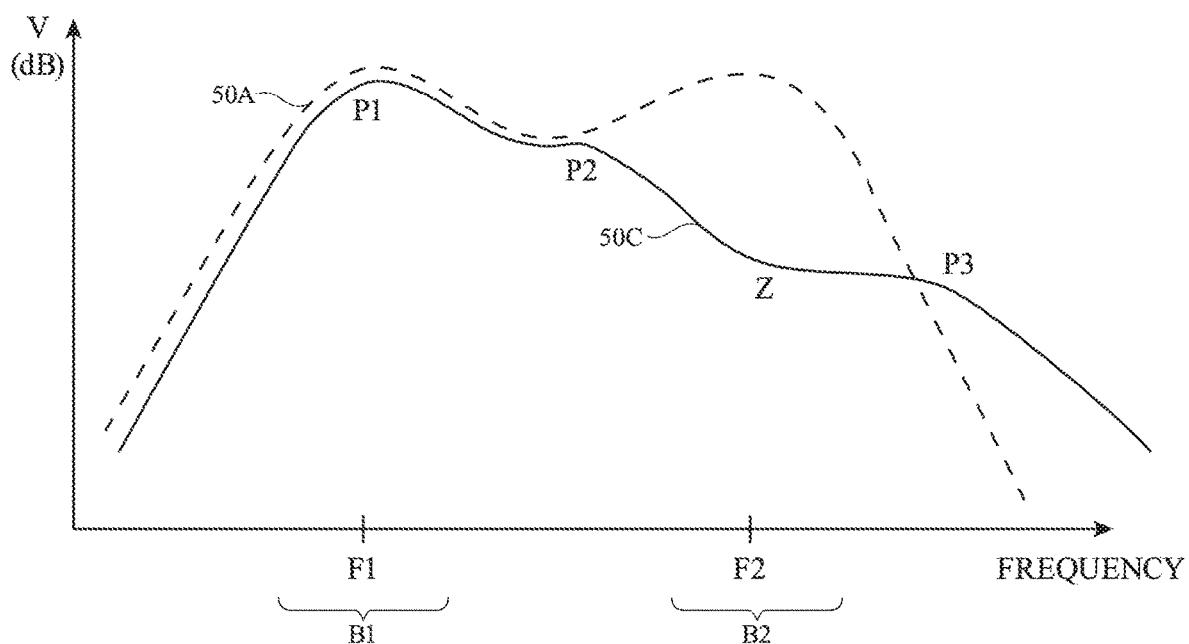
FIG. 12 is a plot of the transfer function of an illustrative multi-coil transformer placed in a second band rejection operating mode in accordance with some embodiments.

FIG. 12 is a plot of the transfer function 50C of adjustable impedance matching network 56 while in the second band rejection operating mode (in voltage V as a function of frequency). As shown in FIG. 12, transfer function 50C may exhibit a first peak (pole) P1, a second peak (pole) P2, and a third peak (pole) P3. The frequency of first pole P1 corresponds to first angular frequency ωp1 (as defined by equation 140 of FIG. 11). The frequency of second pole P2 corresponds to second angular frequency ωp2 and the frequency of third pole P3 corresponds to third angular frequency ωp3, as defined by equations 144 of FIG. 11. Transfer function 50C may also exhibit a zero Z. The frequency of zero Z corresponds to zero angular frequency ωz, as defined by equation 142 of FIG. 11.

Poles P2 and P3 may be shaped by selecting corresponding inductances and capacitances for inductors L1 and L4 and capacitors C1 and C4 (e.g., as shown by equations 144). Pole P1 may be shaped by selecting a corresponding inductance and capacitance for first inductor L1 and capacitor C1 (e.g., as shown by equation 140). Zero Z may be shaped by selecting a corresponding inductance and capacitance for fourth inductor L4 and adjustable capacitor C4. Poles P1, P2, and P3 and zero Z may be shaped to align zero Z with a frequency F2 in second frequency band B2 and to align poles P1 and P2 with first frequency band B1. This may configure adjustable impedance matching network 56 to receive or transmit in first frequency band B1 while blocking interference signals in first frequency band B2.

Figure 13:
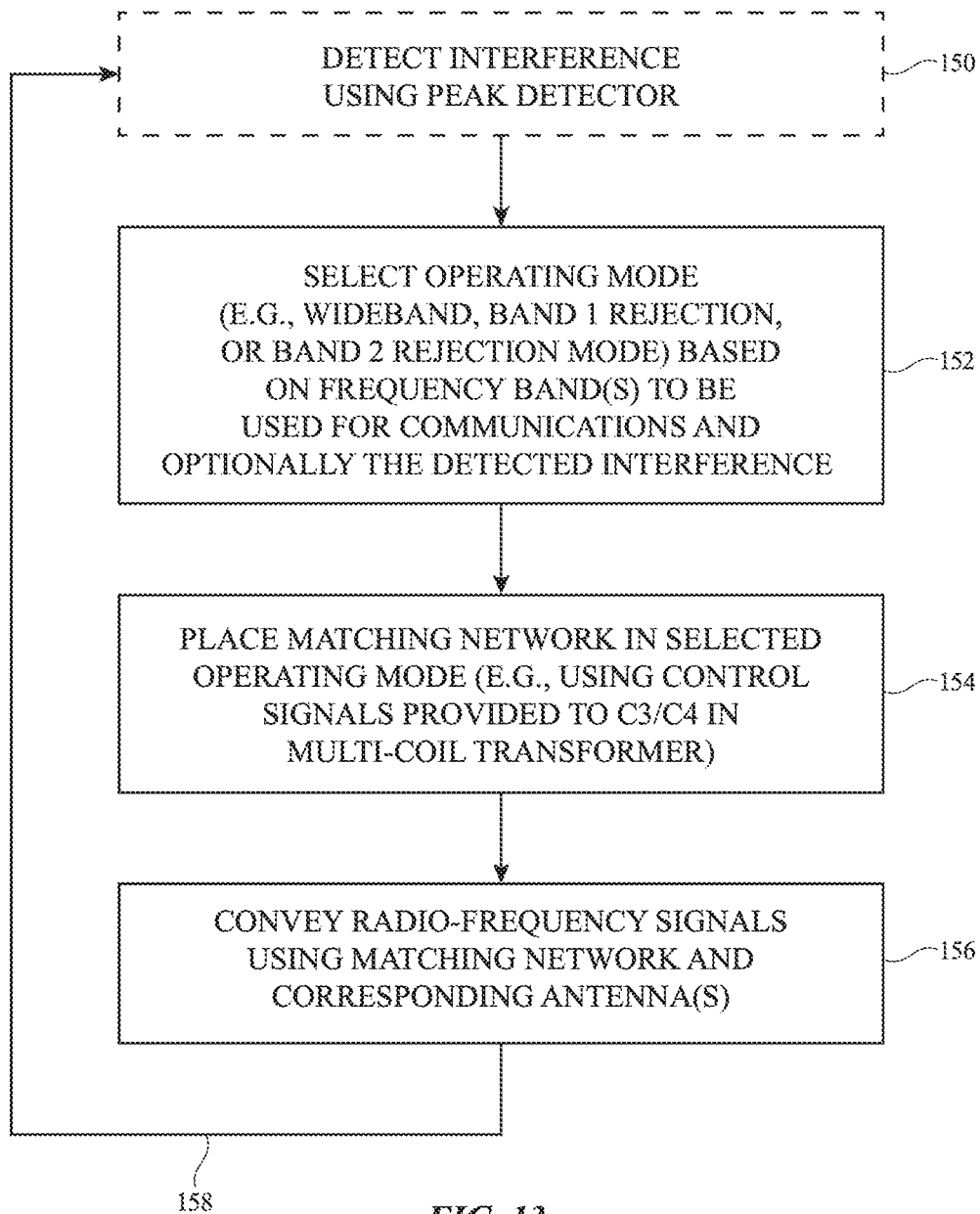
FIG. 13 is a flow chart of illustrative operations that may be performed by wireless circuitry to convey radio-frequency signals while adjusting a multi-coil transformer between wideband, first band rejection, and second band rejection operating modes.

FIG. 13 is a flow chart of illustrative operations that may be performed by wireless circuitry 24 to convey radio-frequency signals while switching adjustable impedance matching network 56 between the wideband, first band rejection, and second band rejection operating modes.

At optional operation 150, peak detector 62 (FIG. 2) may measure the signal flowing through signal paths 54-1 and 54-2 to detect one or more signal peaks produced by interference signal(s) at one or more frequencies. Peak detector 62 may be interposed on inductors L3 and/or L4 of FIG. 4, as an example. Peak detector 62 may detect (e.g., measure, determine, identify, generate, etc.) the one or more frequencies of the interference signal(s). This may allow peak detector 62 to assess the real-time spectral characteristics of adjustable impedance matching network 56.

At operation 152, control circuitry 14 may select an operating mode for adjustable impedance matching network 56. For example, control circuitry 14 may select the wideband operating mode, the first band rejection operating mode, or the second band rejection operating mode. Control circuitry 14 may select the operating mode based on the frequency band(s) to be used by wireless circuitry 24 to transmit or receive radio-frequency signals (e.g., as assigned to device 10 by a wireless base station or access point, as determined by the wireless communications protocol governing wireless circuitry, etc.). Control circuitry 14 may additionally or alternatively select the operating mode based on the interference signals detected by the peak detector and/or any other desired sensor data gathered by device 10.

As examples, when device 10 has been assigned to communicate using both first frequency band B1 and second frequency band B2 (e.g., using inter-band CA) and peak detector 62 does not detect any interference signals in frequency bands B1 and B2, control circuitry 14 may select the wideband operating mode. When device 10 has been assigned to communicate using only a single frequency band (e.g., when device 10 has been configured to operate without inter-band CA), control circuitry 14 may select the wideband operating mode, the first band rejection mode, or the second band rejection mode. When device 10 has been assigned to communicate using first frequency band B1 (e.g., without inter-band CA) or when device 10 has been assigned to communicate using first frequency band B1 and second frequency band B2 (e.g., with inter-band CA) but peak detector 62 detects an interference signal peak in second frequency band B2, control circuitry 14 may select the second band rejection mode. Conversely, when device 10 has been assigned to communicate using second frequency band B2 (e.g., without inter-band CA) or when device 10 has been assigned to communicate using first frequency band B1 and second frequency band B2 (e.g., with inter-band CA) but peak detector 62 detects an interference signal peak in first frequency band B1, control circuitry 14 may select the first band rejection mode. These examples are merely illustrative and, in general, control circuitry 14 may select the operating mode based on any desired control inputs or triggers.

At operation 154, control circuitry 14 may place adjustable impedance matching network 56 in the selected operating mode. For example, control circuitry 14 may use control signals CTRL provided to adjustable capacitors C3 and C4 in multi-coil impedance transformer 68 to place the adjustable impedance matching network in the selected operating mode. Control signals CTRL may control adjustable capacitors to form open circuits and/or to adjust the non-open circuit value of one of the adjustable capacitors. Control circuitry 14 may actively adjust the non-open circuit value of one of the adjustable capacitors to tune the zero frequency of adjustable impedance matching network 56 (e.g., to align the zero frequency with the detected frequency of the interference signal). This may allow adjustable impedance matching network 56 to be dynamically configured to reject the interference signal even as the frequency of the interference signal changes over time.

At operation 156, adjustable impedance matching network 56 and one or more corresponding antennas 34 (FIG. 1) may convey radio-frequency signals while adjustable impedance matching network 56 is in the selected operating mode. This may allow adjustable impedance matching network 56 to cover a relatively wide bandwidth when needed (e.g., during inter-band CA) while also dynamically rejecting interference signals that may arise over time (e.g., thereby maximizing signal sensitivity and radio-frequency performance) without undesirably increasing the chip area consumed by the matching circuitry. Processing may subsequently loop back to operation 150 (or operation 152 when operation 150 is omitted) via path 158, allowing wireless circuitry 24 to continue communications while adapting to changing interference conditions over time.

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The methods and operations described above in connection with FIGS. 1-13 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. A transformer configured to receive radio-frequency signals conveyed along a signal path, comprising:
    a first inductor disposed on the signal path;
    a second inductor disposed on the signal path and at least partially overlapping the first inductor;

a third inductor disposed adjacent a portion of the first inductor and at least partially overlapping the second inductor; and a fourth inductor at least partially overlapping the first inductor, the second inductor, and the third inductor.

2. The transformer of claim 1, further comprising:
a first adjustable capacitor coupled between terminals of the fourth inductor.

3. The transformer of claim 2, further comprising:
a second adjustable capacitor coupled between terminals of the third inductor.

4. The transformer of claim 3, wherein the first adjustable capacitor is configured to receive control signals that selectively control the first adjustable capacitor to form an open circuit between the terminals of the fourth inductor and the second adjustable capacitor is configured to receive control signals that selectively control the second adjustable capacitor to form an open circuit between the terminals of the third inductor.

5. The transformer of claim 3, wherein the first adjustable capacitor and the second adjustable capacitor are configured to receive control signals that selectively configure the transformer to pass the radio-frequency signals in a first frequency band and a second frequency band that is higher than the first frequency band, in the first frequency band but not the second frequency band, or in the second frequency band but not the first frequency band.

6. The transformer of claim 1, wherein the first inductor and the fourth inductor have a first magnetic coupling characterized by a first coupling constant and the second inductor and the fourth inductor have a second magnetic coupling characterized by a second coupling constant equal to the first coupling constant.

7. The transformer of claim 6, wherein the first inductor and the third inductor have a third magnetic coupling characterized by a third coupling constant and the second inductor and the third inductor have a fourth magnetic coupling characterized by a fourth coupling constant equal to a negative of the third coupling constant.

8. The transformer of claim 1, wherein the first inductor and the third inductor have a first magnetic coupling characterized by a first coupling constant and the second inductor and the third inductor have a second magnetic coupling characterized by a second coupling constant equal to a negative of the first coupling constant.

9. The transformer of claim 1, wherein the fourth inductor surrounds an entirety of the fourth inductor and wherein the third inductor does not overlap the first inductor.

10. The transformer of claim 1, wherein the third inductor and the fourth inductor are floating with respect to the signal path.

11. An electronic device comprising:
an antenna;
a signal path communicably coupled to the antenna and configured to convey radio-frequency signals for the antenna; and
an impedance matching network comprising
a first inductor disposed on the signal path,
a second inductor disposed on the signal path, the first inductor being magnetically coupled to the second inductor with a first coupling constant, and
a third inductor magnetically coupled to the first inductor with a second coupling constant and magnetically coupled to the second inductor with a third coupling constant equal to a negative of the second coupling constant.

12. The electronic device of claim 11, wherein the impedance matching network further comprises:
a fourth inductor magnetically coupled to the first inductor with a fourth coupling constant and magnetically coupled to the second inductor with a fifth coupling constant equal to the fourth coupling constant.

13. The electronic device of claim 11, further comprising:
an adjustable capacitor coupled between terminals of the third inductor.

14. The electronic device of claim 13, wherein the adjustable capacitor has a first state in which the adjustable capacitor forms an open circuit in the third inductor and has a second state in which the adjustable capacitor forms a non-open circuit capacitance in the third inductor.

15. The electronic device of claim 14, further comprising:
a peak detector configured to detect a frequency of an interference signal in the radio-frequency signals; and
control circuitry configured to tune the non-open circuit capacitance of the adjustable capacitor based on the detected frequency of the interference signal.

16. The electronic device of claim 11, wherein the third inductor overlaps the second inductor but not the first inductor.

17. The electronic device of claim 11, further comprising:
a low noise amplifier disposed on the signal path, wherein the impedance matching network is interposed between stages of the low noise amplifier.

18. A method of operating an electronic device having a signal path with a transformer that includes a first coil, a second coil, a third coil, a fourth coil, a first adjustable capacitor coupled to the third coil, and a second adjustable capacitor coupled to the fourth coil, the method comprising:
forming a first open circuit in the third coil and a second open circuit in the fourth coil, the first open circuit in the third coil and the second open circuit in the fourth coil configuring the transformer to pass radio-frequency signals in a first frequency band and a second frequency band higher than the first frequency band; and
forming the second open circuit in the fourth coil and controlling the first adjustable capacitor to form a non-open circuit capacitance in the third coil, the second open circuit in the fourth coil and the non-open circuit capacitance in the third coil configuring the transformer to pass the radio-frequency signals in the second frequency band while filtering out the first frequency band.

19. The method of claim 18, further comprising:
forming the first open circuit in the third coil and controlling the second adjustable capacitor to form a non-open circuit capacitance in the fourth coil, the first open circuit in the third coil and the non-open circuit capacitance in the fourth coil configuring the transformer to pass the radio-frequency signals in the first frequency band while filtering out the second frequency band.

20. The method of claim 19, further comprising:
with a peak detector, detecting a frequency of signal interference in the radio-frequency signals; and
with one or more processors, adjusting the first adjustable capacitor and the second adjustable capacitor based on the detected frequency of the signal interference.

* * * * *